(12) United States Patent
McCasland et al.

(10) Patent No.: US 7,274,184 B1
(45) Date of Patent: Sep. 25, 2007

(54) SYSTEMS AND METHODS FOR LOCATING A CIRCUIT

(75) Inventors: Steven Thomas McCasland, Highlands Ranch, CO (US); Thomas A. McCasland, Evergreen, CO (US)

(73) Assignee: TASCO, Inc., Englewood, CO (US)

( * ) Notice: Subject to any disclaimer, the term of this patent is extended or adjusted under 35 U.S.C. 154(b) by 0 days.

(21) Appl. No.: 11/301,571

(22) Filed: Dec. 12, 2005

Related U.S. Application Data

(60) Provisional application No. 60/637,687, filed on Dec. 20, 2004.

(51) Int. Cl.
*G01R 19/00* (2006.01)
*G01V 3/11* (2006.01)

(52) U.S. Cl. .......................... 324/67; 324/326

(58) Field of Classification Search ................ 324/66, 324/67, 326

See application file for complete search history.

(56) References Cited

U.S. PATENT DOCUMENTS

| | | | | |
|---|---|---|---|---|
| 4,642,556 A | * | 2/1987 | Pecukonis | ..................... 324/67 |
| 4,665,369 A | * | 5/1987 | Faller et al. | ................. 324/326 |
| 5,438,266 A | * | 8/1995 | Tsang | ........................... 324/326 |
| 5,920,194 A | * | 7/1999 | Lewis et al. | ................. 324/326 |
| 6,130,539 A | * | 10/2000 | Polak | ........................... 324/326 |
| 6,163,144 A | * | 12/2000 | Steber et al. | .................. 324/67 |
| 6,392,395 B2 | * | 5/2002 | Roberts et al. | ............... 324/66 |
| 6,724,191 B1 | * | 4/2004 | Larsen | ........................ 324/329 |
| 6,933,712 B2 | * | 8/2005 | Miller et al. | ................... 324/67 |
| 7,057,383 B2 | * | 6/2006 | Schlapp et al. | ................ 324/67 |
| 7,057,401 B2 | * | 6/2006 | Blades | ........................ 324/713 |

\* cited by examiner

*Primary Examiner*—Edward Lefkowitz
*Assistant Examiner*—Kenneth J. Whittington
(74) *Attorney, Agent, or Firm*—Gregory T. Fettig; Marsh Fischmann & Breyfogle LLP

(57) ABSTRACT

Systems and methods presented herein are generally directed to the location and/or identification of a circuit within a circuit. In one embodiment, a transmitter is configured for inducing a signal upon a circuit (e.g., power lines, communication lines, lighting circuits, etc.) to identify it from other circuit lines. The signal may be induced upon an individual element of the circuit through direct contact. A receiver may receive a radiated component of the signal from a distal point on the circuit to acquire the signal induced thereon and determine a strength of the signal received. Based on the received signal component, the receiver may determine location, configuration, and/or identification of the circuit from which the radiated signal is being received.

24 Claims, 18 Drawing Sheets

SYSTEMS AND METHODS FOR LOCATING A CIRCUIT

CROSS-REFERENCE TO RELATED APPLICATIONS

This application claims priority to and thus the benefit of an earlier filing date from U.S. Provisional Patent Application No. 60/637,687 (filed Dec. 20, 2004), the entire contents of which are incorporated herein by reference.

BACKGROUND

1. Technical Field

Circuit detection systems and methods presented herein provide for determining circuit configurations, directional layouts and/or locations of circuits.

2. Discussion of Related Art

Circuit location and identification becomes increasingly difficult as the number of circuits increases and the circuits themselves become more complex. For example, large office buildings have exceptionally large electric and electronic cabling requirements. These cabling requirements of office buildings frequently change because the needs of the tenants often change. When a tenant desires a change in office space functionality (e.g., power, communications, lighting, etc.), an electrician is often tasked to reconfigure the cabling of the office building to accommodate the tenant's needs. The changing requirements of tenants often result in more complex circuits with certain lines therein becoming unidentifiable.

The changing needs for electric and electronic cabling are not limited to office buildings, however. Homes and industrial buildings also have changing requirements for electric and electronic cabling due to improvements and/or modifications to such structures. For example, a homeowner may wish to add another power outlet to a particular location in the home. As most homes are configured with at least one circuit breaker box in which many power lines are centrally connected, the homeowner (i.e. through the assistance of an electrician) may run a line from the desired power outlet to a circuit breaker within the breaker box. As is often the case in a circuit breaker box, correctly connecting this new line, and integrating it with existing lines, is difficult as lines are often unidentifiable and/or mislabeled.

Furthermore, even when a circuit's various nodes (e.g. outlets, junction boxes, routers, sinks and drains) are determined, it is often difficult to trace the path of the circuit. This difficulty arises out of the common practice of routing the circuit out of sight, for example, through walls, in ceilings, through basements and/or through attics. Therefore, even if a node of a circuit is known, the path that circuit takes to get to another node may be hard to discover. Some present techniques of determining a circuit configuration include, for example, making exploratory holes in walls or ceilings and/or making educated guesses as to the direction in which a circuit is oriented.

Other techniques for identifying circuit may include positioning a person (e.g., an electrician) at a circuit breaker box and another person at the power outlet. The person located at the power outlet may use a test device (e.g., a test light that plugs into the outlet) while the person positioned at the circuit breaker box arbitrarily "flips" circuit breakers until the person at the power outlet communicates that the circuit breaker has been identified. This process is a time-consuming process that utilizes multiple people and can remove power from a mission-critical circuit. Many organizations (e.g., those which run electronic business systems, electronic hospital systems, computing systems, etc.) simply cannot afford a power loss while a circuit breaker is being "flipped" or tested.

Similarly, many situations make tracing the path of an existing circuit to discover its routing and/or its extent via traditional means impractical. For example, some circuits are routed in construction features that are not easily removed, replaced and/or repaired.

SUMMARY

Systems and methods presented herein are generally directed to the location and identification of a circuit line. The systems and methods presented may advantageously provide for rapid circuit identification, location, mapping, charting, determination or any combination thereof. In this regard, a first aspect of the invention is generally directed to method of determining a conductor configuration. The method includes inducing a signal on a conductor at a first point, receiving a radiated component of the signal at a second point that is distal to the first point, and determining a signal strength of the radiated component of the signal to determine a configuration of the conductor. For example, determining the configuration of the conductor may include determining a connection of the conductor at a circuit box and/or determining a location of the conductor within a structure.

Inducing a signal may include inducing the signal on a conductor that is carrying another signal. Alternatively, inducing a signal may include electrically coupling a transmitter to the first point.

Receiving a radiated component of the signal includes detecting magnetic energy with at least two inductors, wherein said at least two inductors are configured at a substantially right angle. In this regard, the method may further include including processing a signal from each of the at least two inductors. For example, processing may include measuring an electromagnetic parameter of a first of the at least two inductors and measuring an electromagnetic parameter of a second of the at least two inductors.

The method may further include displaying information in response to receiving the radiated component of the signal, wherein the information includes the signal strength. For example, displaying may include updating the information with direction information indicating a path of the conductor and/or indicating a device orientation.

Another aspect of the invention is generally directed to a system that determines a circuit configuration. The system includes a transmitter that induces a signal in a conductor at a first location and a receiver that detects a radiated component of the signal at a second location to determine a configuration of the conductor, wherein the second location is distal to the first location. The receiver may be further configured to determine a connection of the conductor at a circuit box and/or the configuration of the conductor within a structure. For example, the configuration of the conductor may include the distance from the conductor to the receiver and/or the direction of the conductor.

The transmitter may induce the signal on a conductor that is carrying another signal. Alternatively, the transmitter may couple electrically to the conductor at the first location.

In one embodiment, the receiver includes at least two inductors, wherein each inductor receives the radiated component of the signal. The inductors may be configured at a substantially right angle. In one embodiment, the inductors are not coupled to one another. The receiver may process a signal from each inductor. For example, the receiver may compare a measurement of a first inductor of said at least two inductors with a measurement of a second inductor of the at least two inductors. Additionally, the receiver may display information relating to the radiated component of the signal. Such information may include, among other things, a signal strength, a path of the conductor, a receiver orientation, or a combination thereof.

Another aspect of the invention is generally directed to an apparatus that determines a location of a circuit. The apparatus includes a first inductor and a second inductor. The first inductor is configured at a substantially right angle in relation to the second inductor. The apparatus also includes a signal selection means coupled to the inductors and a signal conditioning means coupled to the signal selection means. The apparatus further includes a processor coupled to the signal conditioning means to compare measurements from each of the inductors to determine the location of the circuit and a display coupled to the processor to display information relating to the location of the circuit.

DETAILED DESCRIPTION OF THE DRAWINGS

Figure 1:
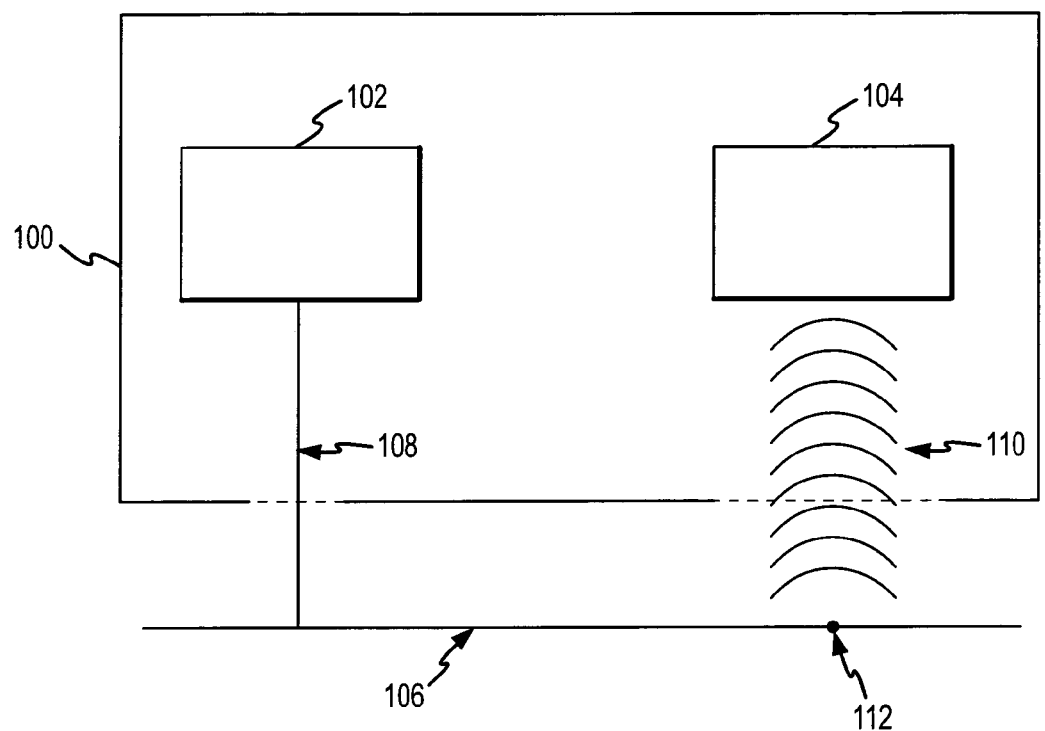
FIG. 1 is a block diagram of an exemplary circuit detection system.

While the invention is susceptible to various modifications and alternative forms, specific embodiments thereof have been shown by way of example in the drawings and are herein described in detail. It should be understood, however, that the following discussion is not intended to limit the invention to the particular forms disclosed but, rather, the invention comprises all modifications, equivalents, and alternatives falling within the scope and spirit of the invention as defined by the claims.

FIG. 1 is a block diagram of system 100 used to locate and/or identify a circuit 106. System includes transmitter 102 and receiver 104. Transmitter 102 introduces signal 108 onto circuit 106 and receiver 104 detects the signal at a point distal to transmitter 102. System 100 may be useful where circuit lines in circuit 106 become mislabeled and/or unidentifiable due to an increase in number and/or complexity of circuit lines in circuit 106. For example, as lines are added to circuit 106 some lines may go unmarked and at least contribute to the complexity of circuit 106. Transmitter 102 and receiver 104 interact through circuit 106 to provide information including a mapping of circuit 106.

Figure 9A:
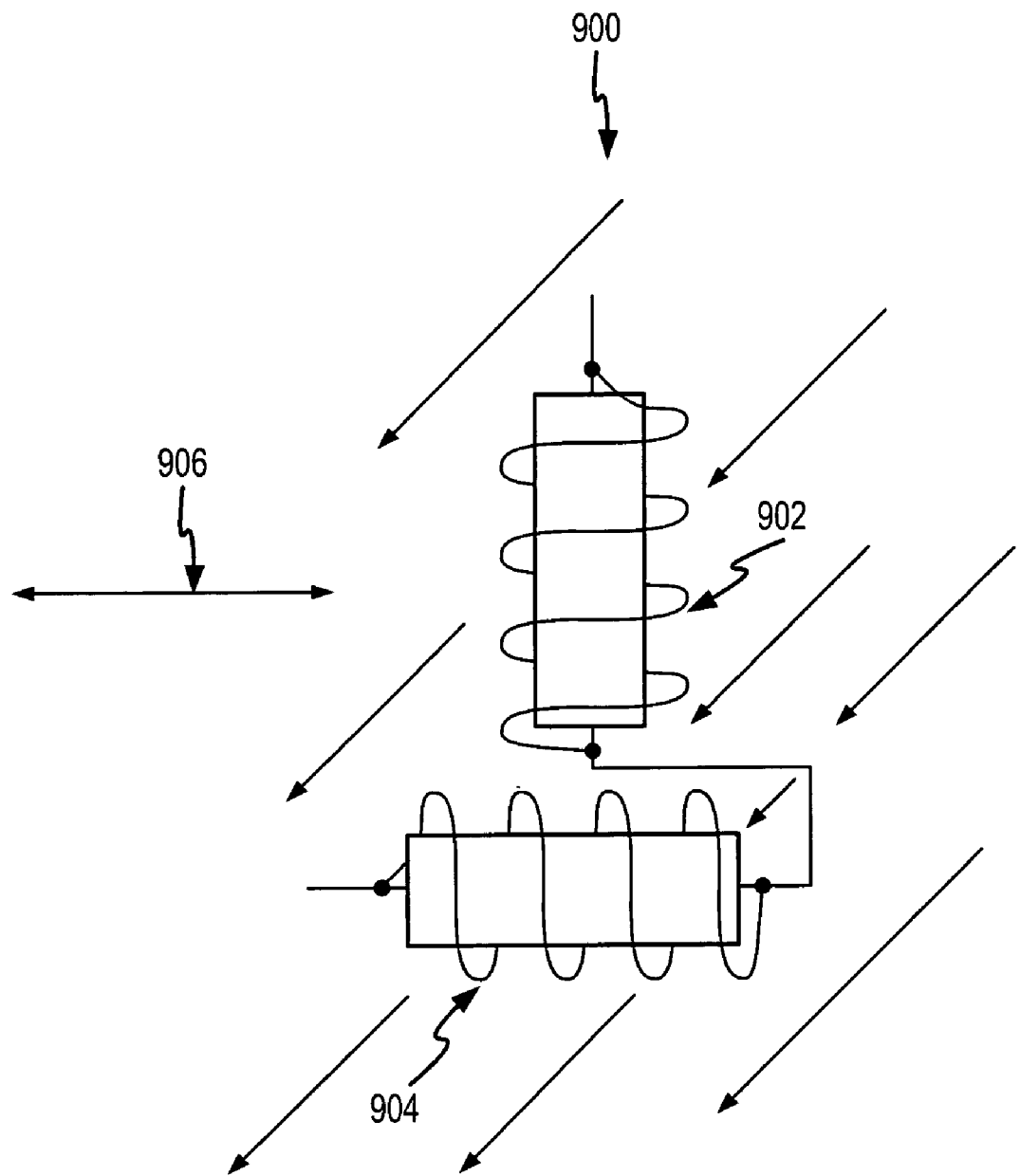
FIG. 9A illustrates an exemplary inductive element configuration for use with a circuit detection receiver.

In one embodiment, receiver 104 receives signal 110 by using inductors to detect signal 110. For example, signal 110 may radiate from a point 112 on circuit 106. Receiver 104 is configured to determine characteristics of signal 110 that indicate the position of the point 112 on circuit 106 from which signal 110 radiates. The inductors (e.g., as shown in FIG. 9A) may be positioned to aid in determining a directional characteristic of signal 110. For example, a directional characteristic of signal may include orientation, location, and/or polarization of the signal. The inductors may receive the signal such that receiver 104 may measure the detected signals of the inductors and process those measurements to produce location information of circuit 106.

Figure 2:
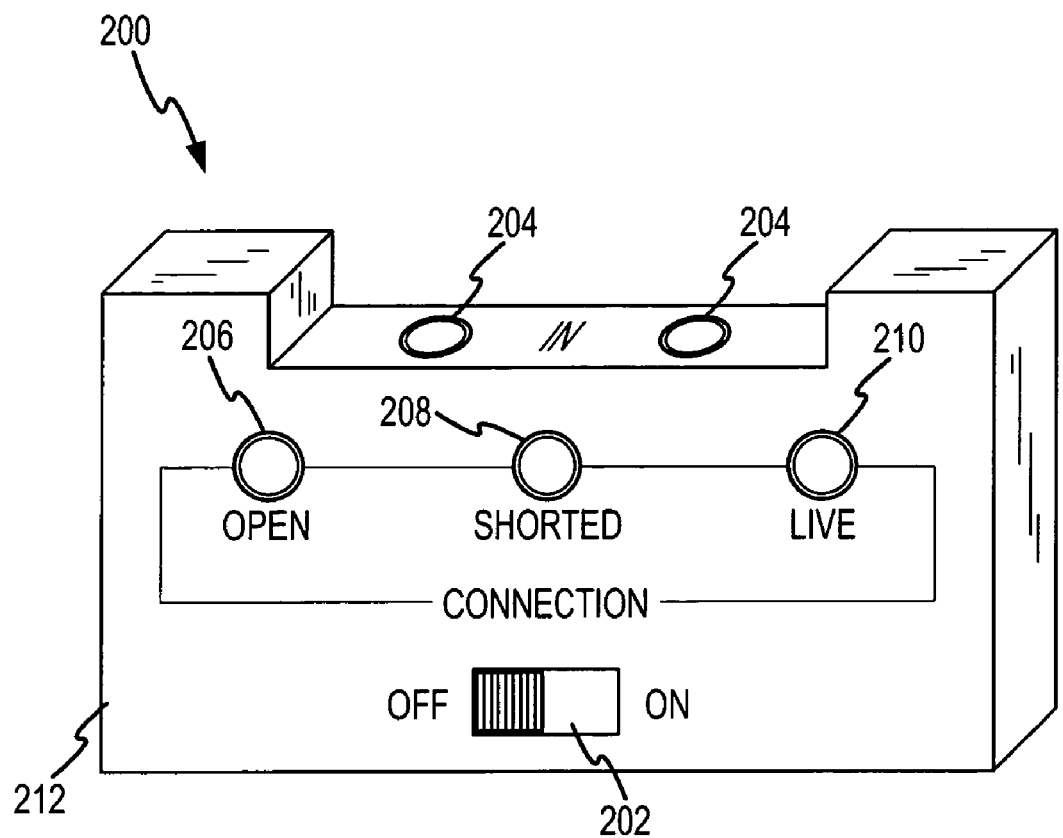
FIG. 2 is a perspective view of an exemplary transmitter.
Figure 4:
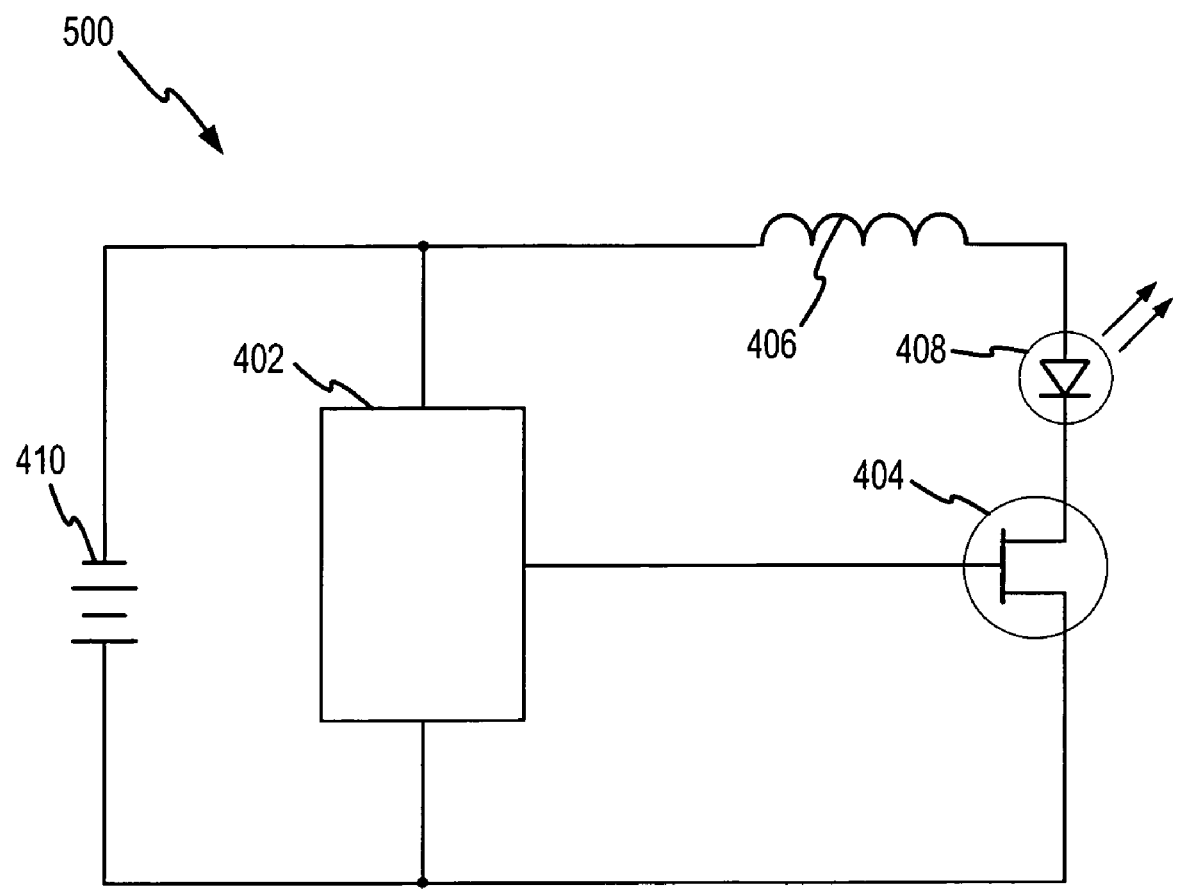
FIG. 4 illustrates a block diagram of an exemplary transmitter for use in plumbing.

FIG. 2 illustrates an exemplary embodiment of a transmitter 200 for use in detecting a circuit, such as transmitter 102 of FIG. 1. Transmitter 200 generates a signal (e.g., signal 108 of FIG. 1) for use in such circuit detection and may couple to circuit 106 via electrical connection or induction. As such, transmitter 200 may either directly or indirectly induce the signal onto circuit 106. Transmitter 200 may include a power source (e.g., as shown in FIG. 4) or receive input power from any appropriate source. For example, transmitter 200 may use power from circuit 106 while it is connected to circuit 106. Another exemplary power source is a battery.

Transmitter 200 may include power switch 202 for controlling operation of transmitter 200 in any appropriate fashion (e.g., turn the transmitter off and on). Transmitter 200 may also include one or more circuit connection terminals 204. Circuit connection terminals 204 may be, for example, wires with connection clips or inductive clips. In one embodiment, circuit connection terminals 204 receive a power signal and transmit signal 108 along circuit 106, both of FIG. 1. Transmitter 200 may also include indicators 206, 208 and 210 of any appropriate size, shape, configuration or type (e.g. light emitting diode, or "LED"). Indicators 206, 208 and 210 may be used to display information relating to circuit 106 or signal 108. For example, indicators 206, 208 and 210 may display information relating to an open circuit (e.g. 206), a shorted circuit (e.g. 208) or a live circuit (e.g. 210). In this regard, circuit connection terminals 204 may detect resistance between two conductors. Transmitter 200 may be combined with an enclosure 212 such that transmitter 200 may be safely held. Additionally, enclosure 212 may be configured for plugging transmitter 200 into a standard household wall socket. In another embodiment, enclosure 212 may be waterproof. Such an enclosure may be useful in an application where circuit is plumbing (further discussed in relation to FIGS. 5, 15 and 16).

Figure 3:
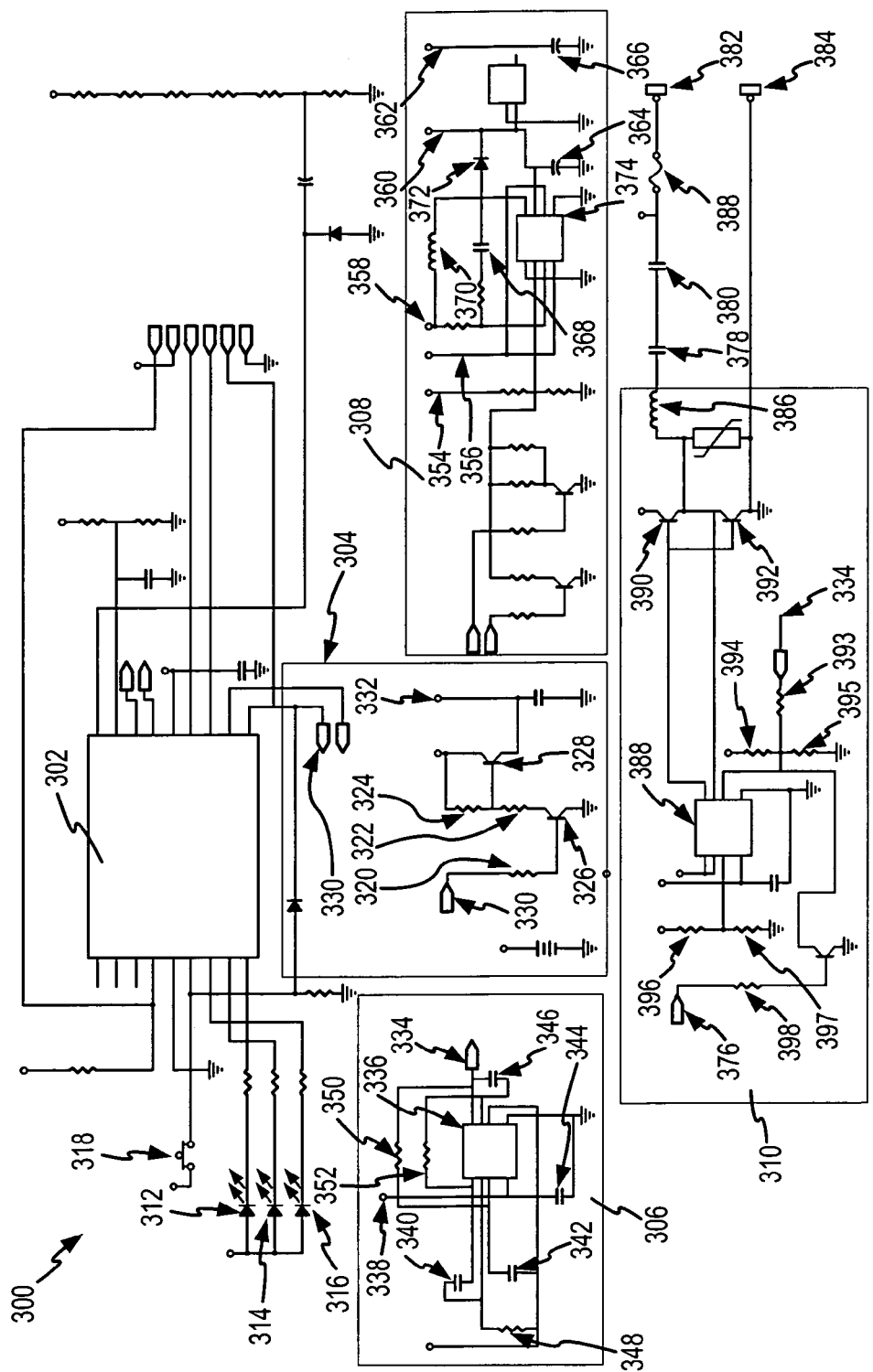
FIG. 3 illustrates a circuit schematic for an exemplary transmitter.

FIG. 3 a circuit diagram of exemplary transmitter 300. Transmitter generates a signal under the control of a microprocessor and induces the signal onto a circuit (e.g., circuit 106) using an output driver circuit. In this regard, transmitter 300 includes microprocessor 302, power enable circuit 304, sinewave generator circuit 306, power control/conditioning circuit 308, and output driver circuit 310. In this embodiment, microprocessor 302 connects with power enable circuit 304, sinewave generator circuit 306, power control/conditioning circuit 308, and output driver circuit 310. Power enable circuit 304 receives power enable signal 330 from microprocessor 302 and supplies power to voltage rail 332. Power control/conditioning circuit 308 creates additional power for voltage rails 354, 356, 358, 360 and 362, and conditions the power through use of filtering (e.g., via capacitors 364, 366 and 368, and voltage regulator 374). Sinewave generator circuit 306 creates a sinewave signal 334 or other signal as controlled by microprocessor 302. Sinewave generator circuit 306 passes signal 334 to output driver circuit 310 which amplifies and otherwise conditions signal 334 for output to through connectors 382 and 384.

Microprocessor 302 controls most of the circuitry included in transmitter 300. Microprocessor 302 commands power enable circuit 304 to power transmitter 300 and enable output from transmitter 300. Microprocessor 302 may also control other various aspects of the operation of transmitter 300, such as the user interface. For instance, microprocessor 302 may control indicators (e.g. LEDs 312, 314 and 316) to display information about the status or mode of transmitter 300. Microprocessor 302 may also receive inputs including, for example, a trigger relating to operation (e.g. switch 318). Microprocessor 302 also generates information relating to signal 108 and the mode of transmitter 302. For example, microprocessor 302 may modulate information onto signal 108. Also, microprocessor 302 may include a state machine to implement a sequence of modes of operation (e.g. operating, transmitting, standby, etc.) Microprocessor 302 may be of any appropriate and/or commercially available type or model (e.g. an embedded controller).

Power enable circuit 304 provides power for operation of other circuits in transmitter 300. Power enable circuit may include resistors 320, 322 and 324 and transistors 326 and 328 for amplifying power enable signal 330 received from microprocessor 302. Power enable circuit 304 may take one voltage and convert it to another voltage and/or couple a voltage onto a particular circuit line (e.g. voltage rail 332).

Sinewave generator circuit 306 receives power from voltage rail 338 and produces sinewave 334. In this regard, sinewave generator circuit 306 may include oscillator 336, a digital-to-analog converter (DAC), filtering components (e.g. capacitors 340, 342, 344 and 346 and resistors 348, 350 and 352) to provide such an output. Sinewave generator circuit 306 may produce a sinewave (e.g. 334). Although illustrated here as configured to produce a sinewave, the characteristics of the generated signal (e.g. 334) may be determined by the application and/or by user input. Those skilled in the art, however, will recognize that the generated signal (e.g. 334) may be modulated or a combination of signals as required by the application to aid in signal detection by the receiver (e.g. 104). Therefore, the invention is not intended to be limited to generated signal 334.

Power control/conditioning circuit 308 may create additional source voltages and condition those voltages for use by circuits within transmitter 300. For example, power control/conditioning circuit 308 may connect to voltage rails (e.g. 354, 356, 358, 360 and 362) in transmitter 300 and filter the voltages to reduce noise or transient signals on the voltage rails 354, 356, 358, 360 and 362. Power control/conditioning circuit 308 may include capacitors 364, 365 and 366, voltage regulator 374, inductor 370 and diode 372 as part of elements used in providing and filtering voltage at rails 354, 356, 358, 360 and 362. Those skilled in the art are familiar with filtering signals and its various implementations.

Output driver circuit 310 uses an output (e.g. sinewave output 334) from sinewave generator circuit 306 in conjunction with output enable signal 376. Output driver circuit 310 conditions a signal to be output from transmitter via connectors 382 and 384. Output driver circuit 310 may include any appropriate stages and/or functions (e.g. voltage splitter 388, scaling, buffering, operational amplifier, modulator) that may be required by the application. For example, voltage splitter 388 uses resistors 393-398 in bias and divider configurations as well as transistors 390 and 392 to create a pair of signals to be imparted by transmitter 300 onto a circuit (e.g., carrying an Alternating Current— "AC"—power signal). Output driver circuit 310 also contains decoupling means (e.g. capacitors 378 and 380 in a high pass configuration) to allow connection with the circuit.

In one embodiment, output driver circuit 310 connects through a plurality of decoupling elements (e.g. capacitors 378 and 380, inductor 386, and fuse 388) with circuit connector 382. Thus, circuit connector 382 may be connected with a high voltage circuit line (e.g. "hot" terminal of a household wall socket.) The output driver circuit 310 also couples directly with circuit connector 384. This direct connection does not require decoupling elements because circuit connector 384 is connected with a low voltage circuit line (e.g. "cold" terminal of a household wall socket) which is used as the ground connection for output driver circuit 310. In one embodiment, the entire circuitry depicted in FIG. 2 may be contained in an electrically insulated enclosure. Those skilled in the art will recognize that there are other suitable connections that may be made. Therefore, although one embodiment is illustrated, the invention is not intended to be limited as such.

Figure 5:
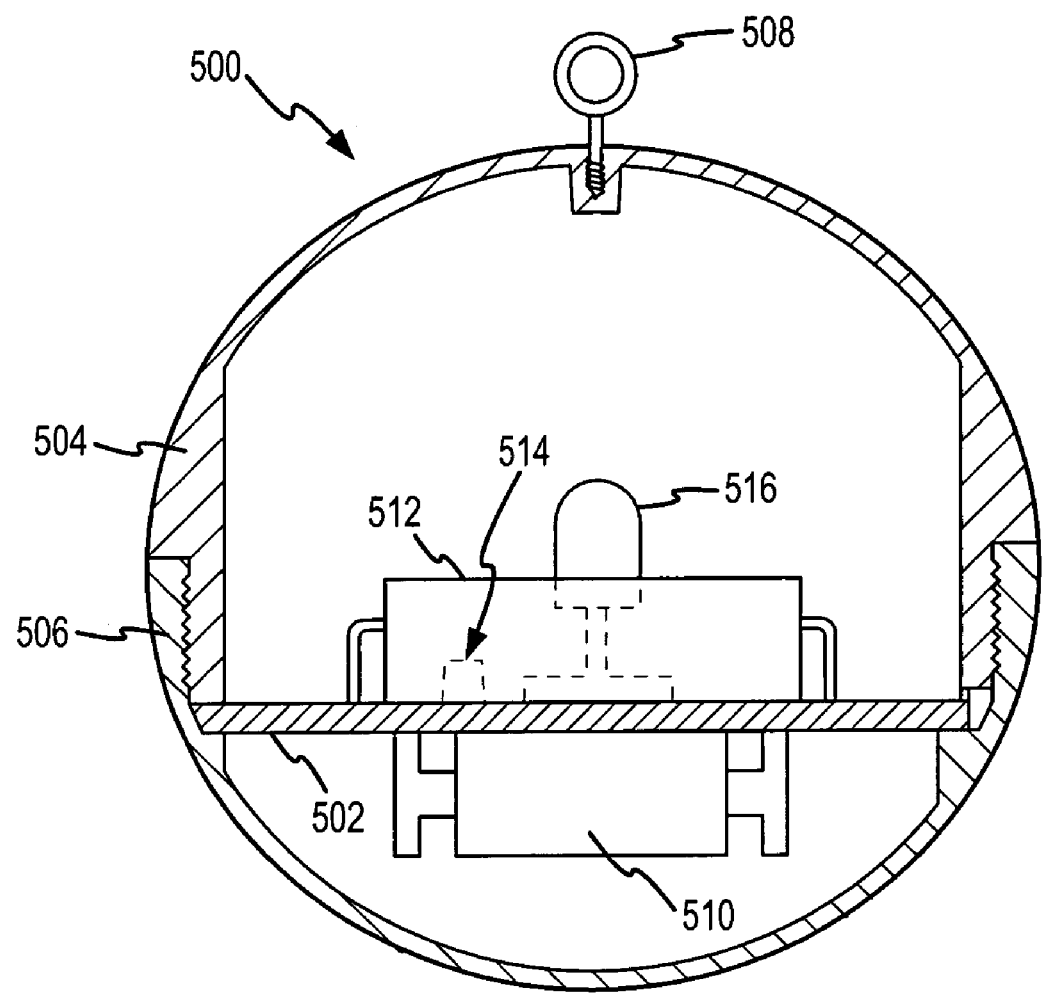
FIG. 5 illustrates a cross-sectional view of an exemplary transmitter for use in plumbing.

FIGS. 4 and 5 illustrate an exemplary embodiment of transmitter 500 adapted for use in plumbing. More specifically, FIG. 4 illustrates a schematic of transmitter 500 and FIG. 5 illustrates a cross-sectional view of transmitter 500. Schematic 400 includes oscillator 402, switch 404, coil antenna 406, indicating light 408 (e.g. LED), and power source 410. Power source 410 provides power to oscillator 402, which in turn drives switch 404 with a signal to be transmitted. Switch 404 delivers the signal to be transmitted to antenna 406. The signal also flows through indicating light 408. Indicating light 408 may not visibly show all of the contents of signal while the signal is transmitting. For example, modulated content of the signal may not be sufficient to trigger indicating light 408 and may, therefore, appear continuously lit even though the signal varies with time.

Transmitter 500 of FIG. 4 may be implemented on circuit board 502 as show in FIG. 5 and configured within enclosure 504 and 506. Transmitter 500 may include upper enclosure 504, lower enclosure 506 that combine to seal circuit 502 from elements (e.g. water). For example, transmitter may also include fastener 508 for optional retrieval of transmitter 500 if desired. Upper and lower enclosures 504 and 506 may also be any appropriate opacity (e.g. transparent, opaque). Assembled on circuit board are battery 510, coil antenna 512, switch and oscillator 514 (shown as a group, with broken lines), and LED 516 (partially shown with broken lines). This embodiment may also include a switch (not shown) as described above for controlling operation of transmitter 500. Transmitter 500 may also include a means for controlling signal 108 generated inside.

Figure 6:
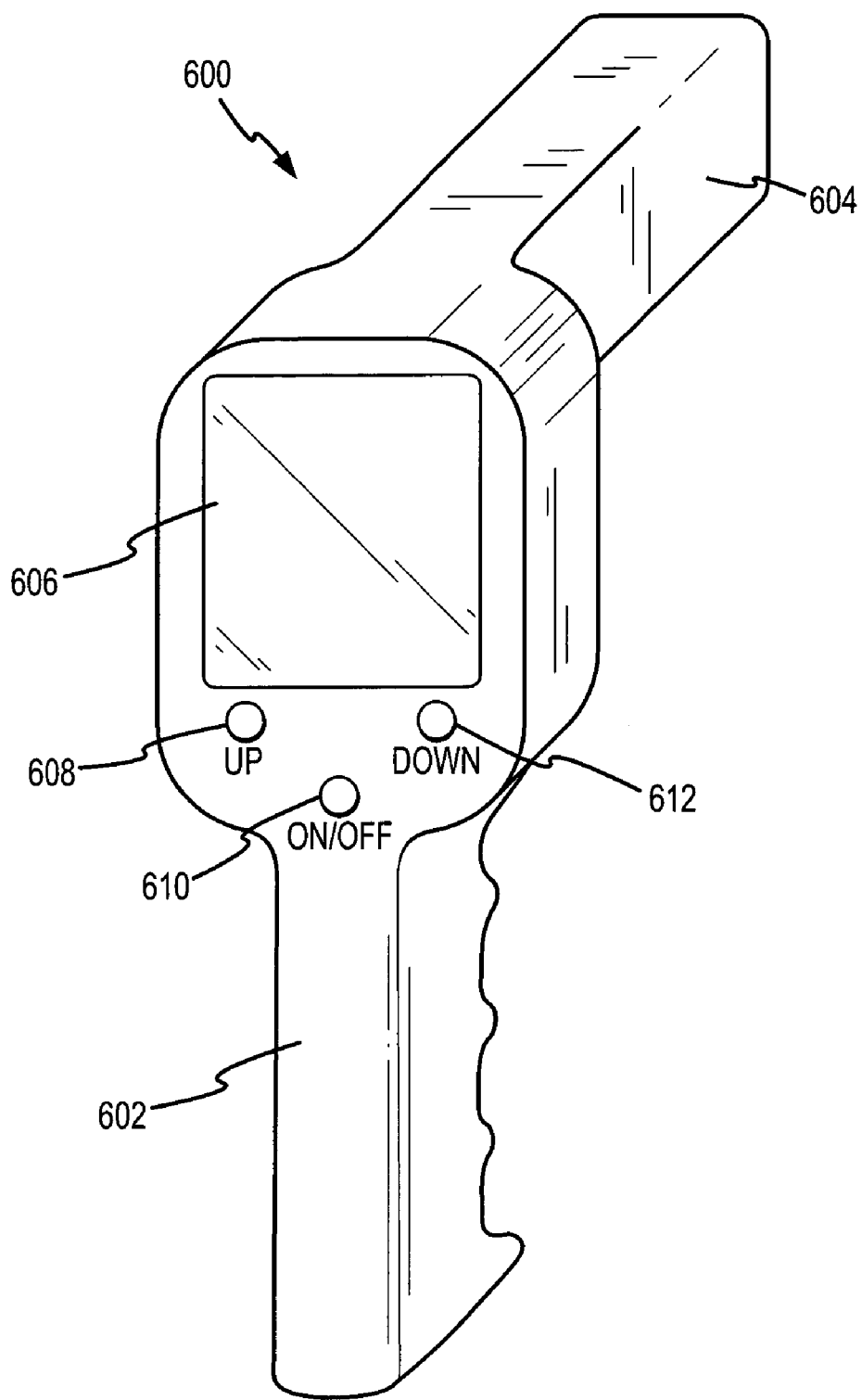
FIG. 6 is a perspective view of an exemplary receiver.

FIG. 6 illustrates an exemplary embodiment of receiver 600. Receiver 600 is configured for receiving a signal at a point distal to transmitter 102 by detecting a radiated component of signal (e.g., its associated electromagnetic field). Receiver 600 may include enclosure 602 including a portion of enclosure 604 for positioning and housing sensing elements (e.g. inductors) in any appropriate manner, configuration or position (e.g. distributed along an axis of the portion of receiver 604 or in pairs at right angles to each other). Receiver 600 may also include interface 606 and one or more inputs 608, 610 and 612. For example, interface 606 may be a ("LCD") crystal display used to display a graphical user interface. Additionally, interface 606 may be configured to display information relating to a received signal, a state of receiver, a battery level, etc.

Figure 7:
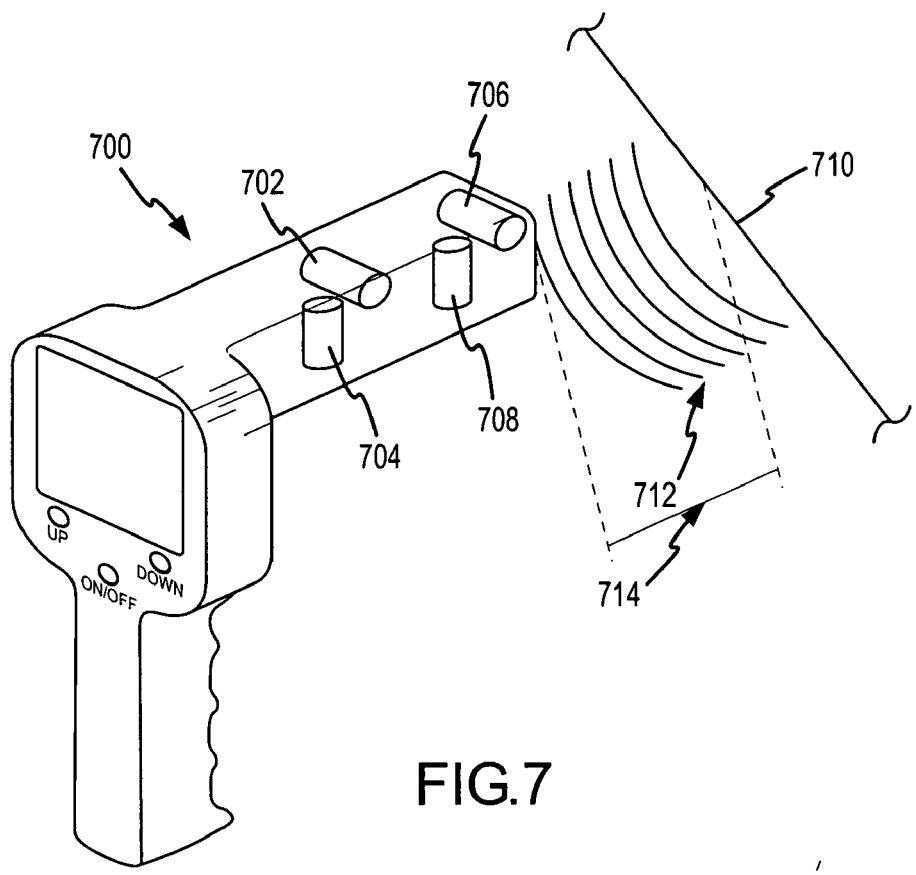
FIG. 7 is a perspective view of a receiver with an exemplary inductive element configuration.

FIG. 7 illustrates one embodiment of receiver 700 including an exemplary positioning of inductors 702, 704, 706 and 708 inside receiver 700. The positioning may be configured to detect an electromagnetic field and determine its orientation through comparison of measurements of inductors (e.g., inductor 702 as compared to inductor 704). For example, inductor 706 is configured at substantially a right angle with respect to inductor 708 and positioned near one end of receiver. Inductor 702 is configured at substantially a right angle with respect to inductor 704 and positioned distal to inductors 706 and 708. Receiver 700 may utilize various placements of inductors 702, 704, 706 and 708 in determining a location of circuit 710. In one embodiment, receiver 700 may compare measurements from inductor 702 and inductor 704 to determine a direction of an electromagnetic field associated with radiated signal 712. Specifically, inductor 702 will have a measurement determined by a horizontal component of the electromagnetic field while inductor 704 will have a measurement determined by a vertical component of the electromagnetic field. Of course, the determination of the direction of the electromagnetic field will be influenced by the orientation of receiver 700 as it is held (e.g. horizontal or vertical). Thus, the determination may include information about the orientation of receiver 700 (e.g., from a sensor as described in FIGS. 12 and 13). Receiver 700 may also compare measurements from inductor 702 and 706 to determine distance 714 from circuit 710 to receiver 700. Specifically, inductor 706 will have a greater voltage measurement if it detects a stronger electromagnetic field due to inductor 706 being closer (e.g., a shorter distance 714) to the source of the field (e.g. circuit 710) than inductor 702.

Figure 8:
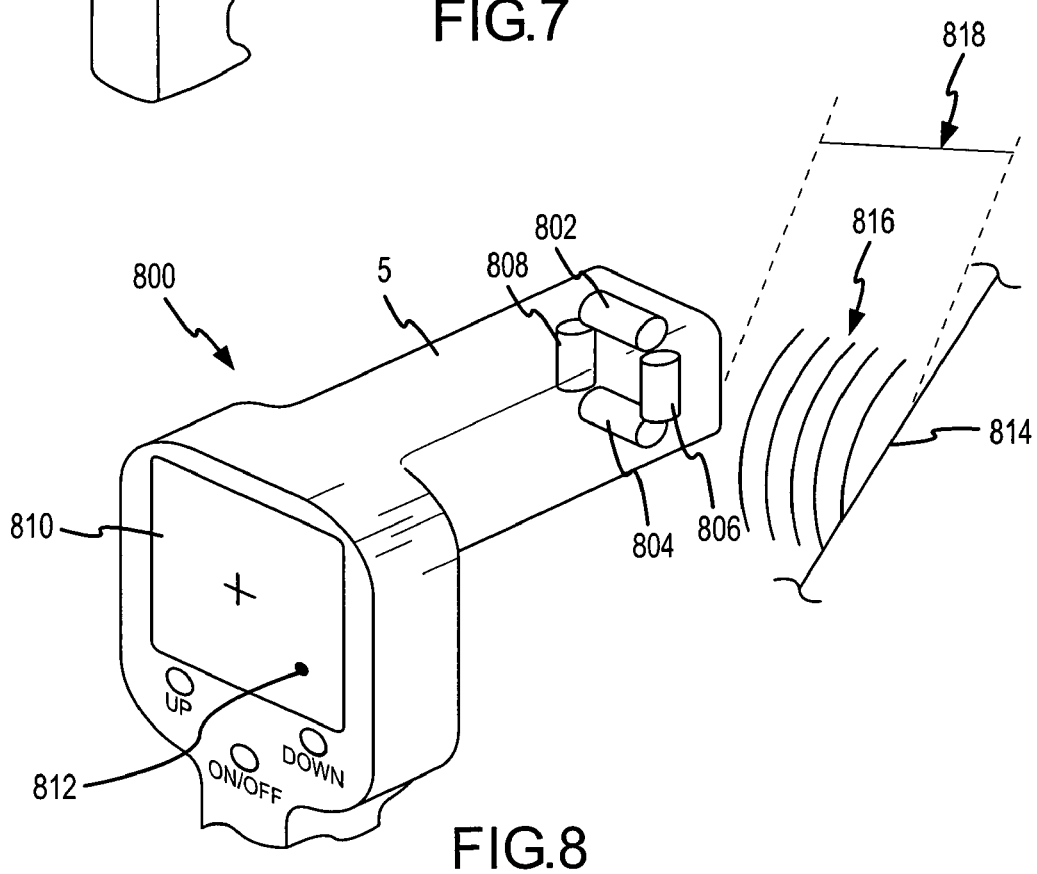
FIG. 8 is a perspective view of a receiver with another exemplary inductive element configuration.

FIG. 8 illustrates another embodiment of receiver 800 including an exemplary positioning of inductors 802, 804, 806 and 808. Inductors 802, 804, 806 and 808 are positioned substantially in a square arrangement. In addition, inductors 802, 804, 806 and 808 are substantially in the same plane as one another and positioned near one end of receiver 800. The measurement from inductor 802 may be compared with the measurement from inductor 804 to determine a distance of receiver 800 from the source (e.g. circuit 814) of an electromagnetic field associated with radiated signal 816. Furthermore, the measurement from inductor 808 may be compared with the measurement from inductor 804 to determine a direction of the electromagnetic field.

Those skilled in the art will recognize that the positions illustrated in FIGS. 7 and 8 are only examples of the possible positions for inductors inside receivers that may be used to determine characteristics of the radiated signal (e.g. 712 and 816). Furthermore, each of the measurements of the inductors may be combined with information about the positioning of the inductor (e.g. horizontal, at a right angle from another inductor) in order to determine a characteristic of radiated signal (e.g., 712 and 816). Each of the embodiments illustrated in FIGS. 7 and 8 may include a display (e.g. 810) capable of indicating information relating to a location (e.g. 812) of circuit (e.g. 814).

FIGS. 9A-9D illustrate examples of how measurements of a field may be made using inductors In these examples, the inductors are illustrated connected to each other in a serial fashion. Measurements may be made across both inductors, thereby summing the measurements and possibly obscuring the individual measurements of each inductor. However, an advantageous configuration of the inductors preserves each individual measurement of the inductors illustrated herein. Thereby the measurements of each inductor may be compared (e.g. as discussed in relation to FIGS. 7 and 8). The discussions of FIGS. 9A-9D include measurements that would be ideally made from the exemplary field and compares the individual measurements with their sum. Thereby, it can be recognized the advantages possible through preserving the individual measurements made of each inductor.

For example, FIG. 9A illustrates a field 900 and inductors positioned at substantially a right angle and a field directed at 135 degrees from horizontal reference angle 906. In response to field 900, inductor 902 and inductor 904 both generate a normalized measurement of 0.707 and their sum equals 1.414. Summing the measurements, thereby, removes information relating to the equality of the measurements of inductors 902 and 904. Receiver 104 may process both measurements individually before using them in combination in order to preserve such information. In this example, the equivalence of the measurements indicates the direction of field 900 (e.g. 135 degrees with respect to horizontal reference angle 906).

Figure 9B:
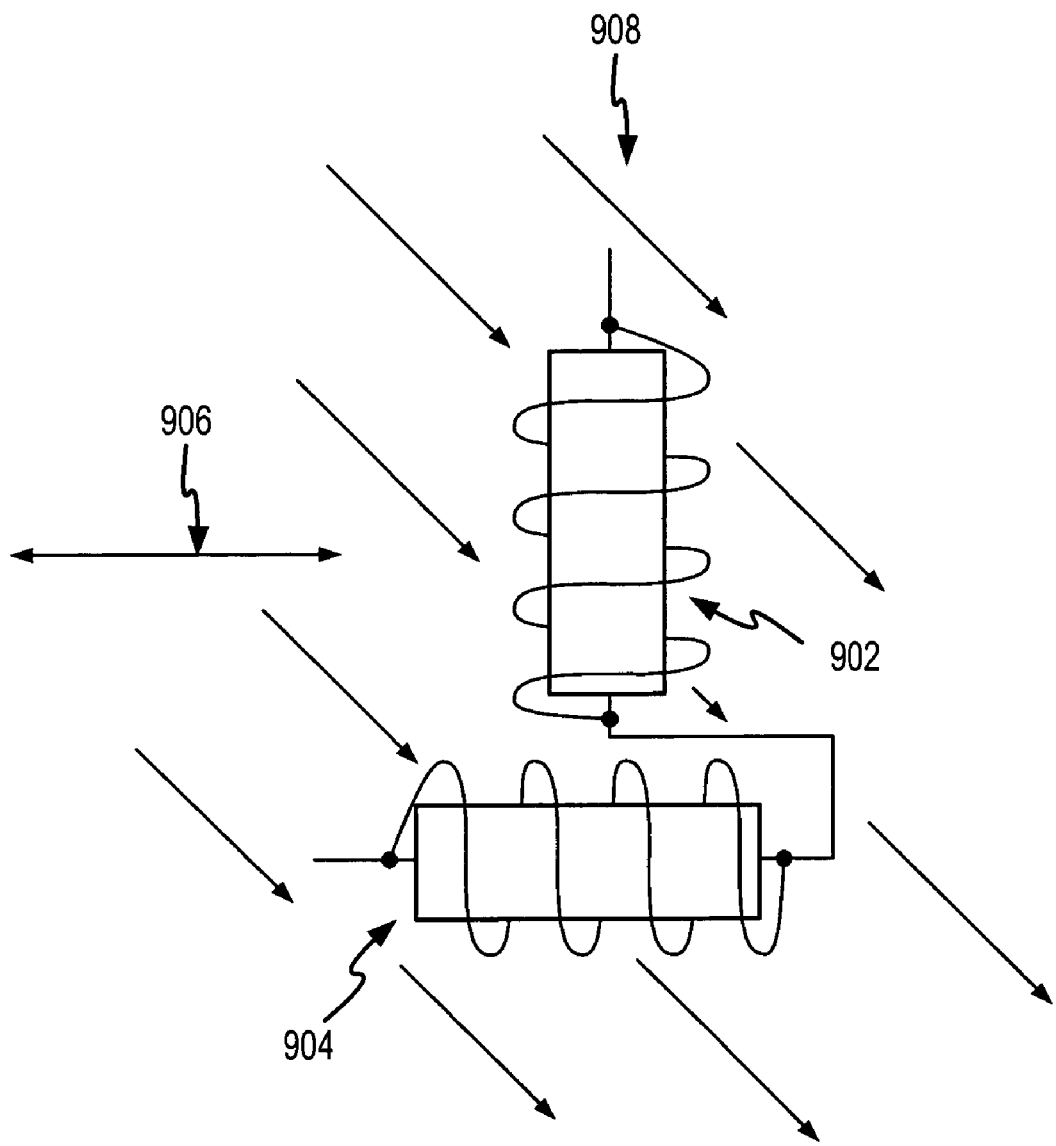
FIG. 9B illustrates the inductive element configuration of FIG. 9A in another field (e.g., rotated).
Figure 9C:
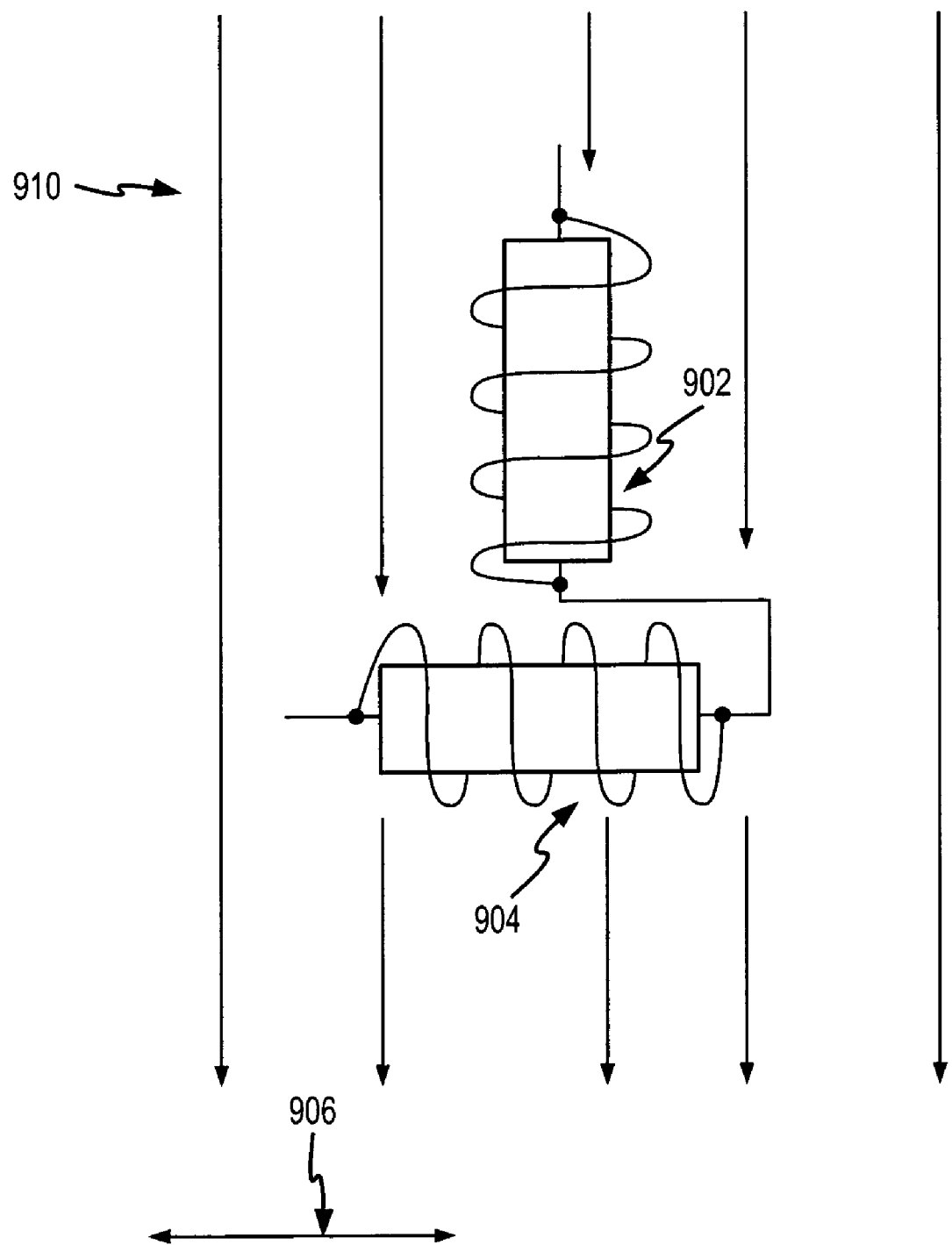
FIG. 9C illustrates the inductive element configuration of FIG. 9A in another field.

FIG. 9B illustrates a field 908 directed at 45 degrees with respect to horizontal reference angle 906. In response to field 908, inductor 902 generates a normalized measurement of 0.707 and inductor 904 generates a normalized measurement of −0.707. The sum of these measurements is substantially zero, while the measurements separately provide more information about the direction of field 908. FIG. 9C illustrates a field 910 directed at 90 degrees with respect to horizontal reference angle 906. In response to field 910, inductor 902 generates a normalized measurement of 0 and inductor 904 generates a normalized measurement of 1. The sum of these measurements is substantially 1, whereas the measurements separately provide more information about the direction of field 910. This example, when viewed with the example in FIG. 9D, is an instance where a sum of the measurements from inductors 902 and 904 provides significantly less information about the direction of field 910 than do the individual measurements of inductors 902 and 904.

Figure 9D:
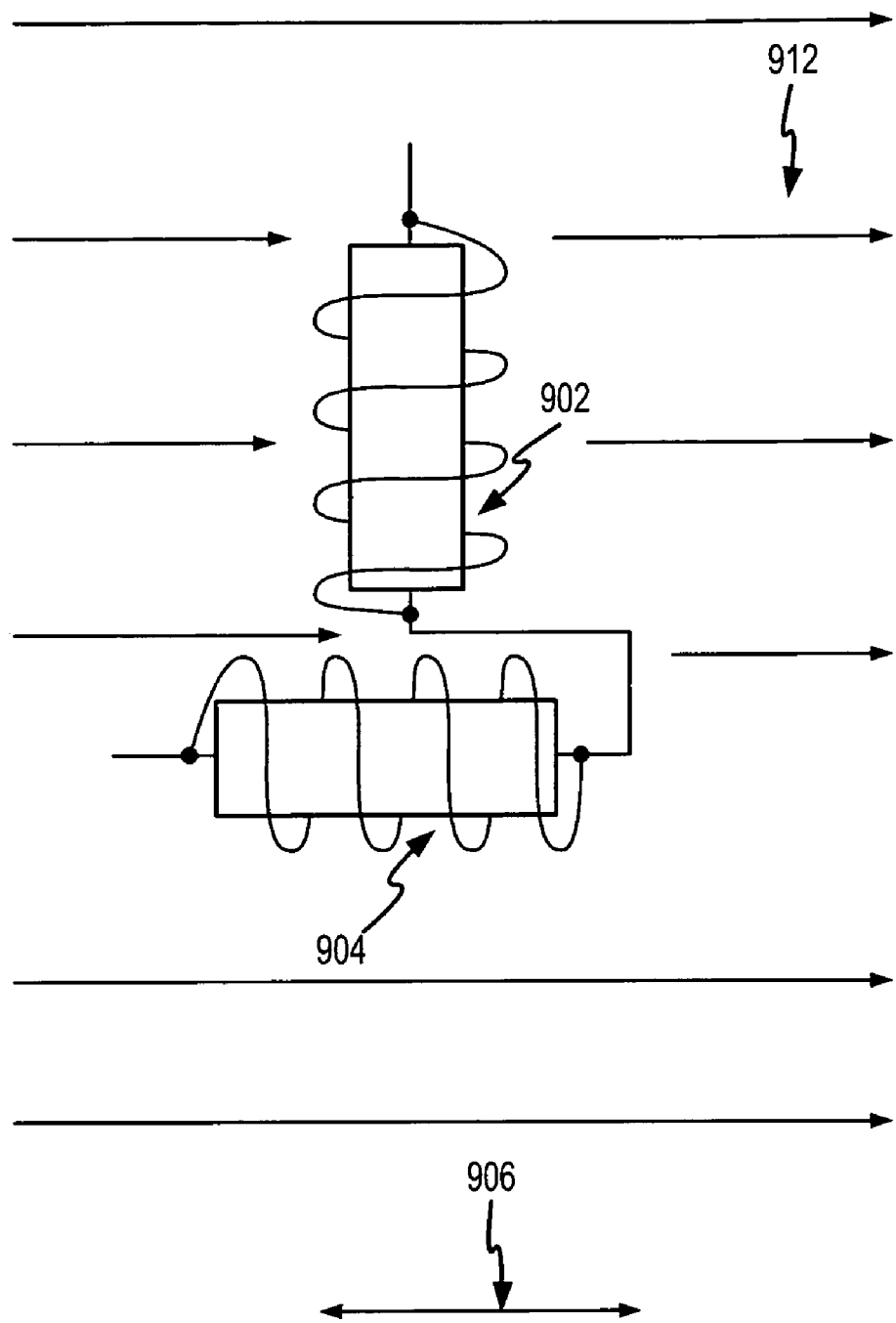
FIG. 9D illustrates the inductive element configuration of FIG. 9A in another field.

FIG. 9D illustrates a field 912 is directed at 0 degrees with respect to horizontal reference angle 906. In response to field 912, inductor 902 generates a normalized measurement of 1 and inductor 904 generates a normalized measurement of 0. The sum of the measurements of inductors 902 and 904 is substantially 1. Thus, the sum of the measurements is substantially the same as the sum of the measurements in the example illustrated in FIG. 9C. However, the direction of field 912 is 90 degrees different from the direction of field 910 (as in FIG. 9C). Accordingly, inductor 902 generates a normalized measurement of 1 and inductor 904 generates a normalized measurement of 0 in response to the field. The sums of measurements illustrated in FIGS. 9C and 9D, therefore, contain less information pertaining to the direction of the field measured than do the individual measurements taken in those examples. Through using the separate measurements of the inductors 902 and 904 (as opposed to the sums of the measurements) the directions of fields 910 and 912 can be readily determined as distinct.

Those skilled in the art will recognize that individual measurements may be used in combination with sums and other combinative functions of those measurements. The invention is not intended to be limited to using individual measurements and may include, for example, using any combination, derivative, integration, comparison or function of the measurements obtained.

Figure 10:
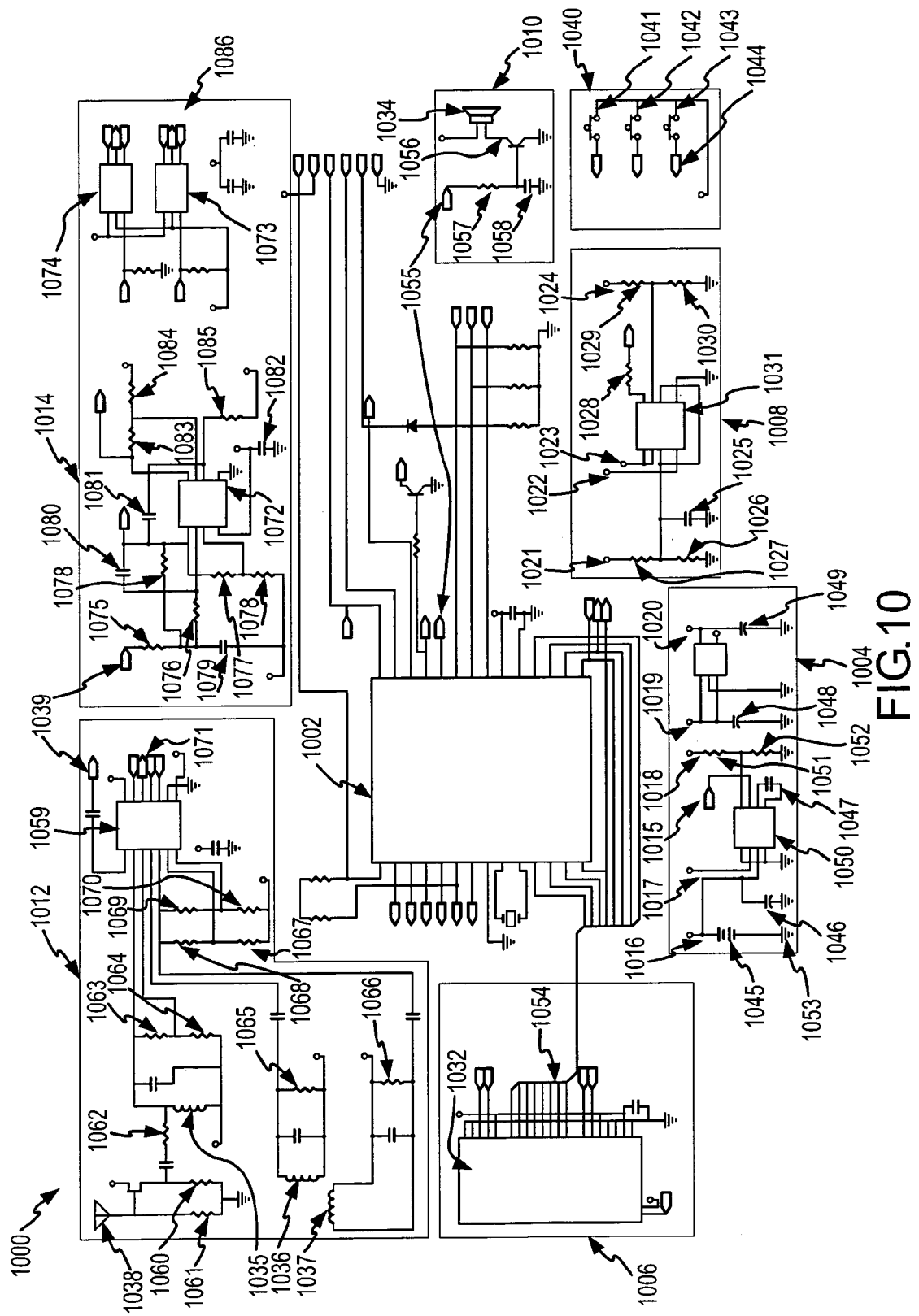
FIG. 10 illustrates a circuit schematic of an exemplary receiver.

FIG. 10 illustrates a circuit diagram of an exemplary receiver 1000. Receiver 1000 may detect, process and store a signal (e.g. 110) radiated from a circuit (e.g. 106). Receiver may also display information relating to the signal (e.g. 110) it detects, including information relating to the location, direction or distance of circuit (e.g. 106). Receiver 1000 includes microprocessor 1002, power control circuit 1004, display circuit 1006, power conditioning circuit 1008, audio output circuit 1010, signal selection circuit 1012 and signal amplification circuit 1014. Microprocessor 1002 connects with power control circuit 1004, display circuit 1006, power conditioning circuit 1008, audio output circuit 1010, signal selection circuit 1012 and signal amplification circuit 1014. Power control circuit 1004 receives power enable signal 1015 from microprocessor 1002 and supplies power to voltage rails 1016-1020. Power conditioning circuit 1008 creates additional power for voltage rails 1021-1024 and/or conditions the power through use of filtering means (e.g. capacitor 1025, resistors 1026-1030, and voltage regulator 1031). Display circuit 1006 creates a display 1032 controlled by microprocessor 1002. Audio output circuit 1010 connects to microprocessor 1002 and outputs audio information via a speaker 1034. Signal selection circuit 1012 receives signals from various sources, for example, inductors 1035-1037 (i.e. detected fields create voltages) and antenna 1038. One of the received signals may then be selected under control of microprocessor 1002 to be passed on to signal amplification circuit 1014. Signal amplification circuit 1014 takes signal 1039 from signal selection circuit 1012 and amplifies, buffers and converts it before passing it to microprocessor 1002 for processing.

Microprocessor 1002 controls most of the circuitry included in receiver 1000. Microprocessor 1002 commands power control circuit 1004 to power receiver 1000 and enable the operating of receiver 1000 such as for the receiving and the processing of signals. Microprocessor 1002 may also control other aspects of the operation of receiver 1000, such as a user interface 1040 and display circuit 1006. For instance, microprocessor 1002 may control display circuit 1006 to display information about the status or mode of receiver 1000. Microprocessor 1002 may also receive inputs 1041-1043 including, for example, power on signal 1044.

Microprocessor 1002 may also process information relating to signal 110 as received by the inductors 1035-1037 and/or antenna 1038 and information relating to the mode of receiver 1002. For example, microprocessor 1002 may determine information about a circuit (e.g. circuit 106 of FIG. 1) via processing of a signal (e.g. signal 110 of FIG. 1) as received by inductors 1035-1037. Also, microprocessor 1002 may include a state machine to implement a sequence of modes of operation (e.g. operating, receiving, standby and/or recall from memory, etc.) Microprocessor 1002 may be of any appropriate and/or commercially available type or model (e.g. an embedded controller or a digital signal processor).

Power control circuit 1004 provides voltage rails 1016-1020 for operation of other circuits in receiver 1000. Power control circuit 1004 receives power enable signal 1015 from microprocessor 1002 initiating a power-on sequence. Power control circuit 1004 may then turn on power to particular voltage rails (e.g. 1016-1020) in a particular sequence. The power-on sequence may also be affected by a user input (e.g. from user interface 1040). Power control circuit 1004 may include battery 1045, capacitors 1046-1049, a voltage regulator 1050 and resistors 1051, 1052. Capacitors may be useful in power control circuit 1004 to filter out noise and/or provide a high-frequency return path to ground 1053. Additionally voltage regulator 1050 may be useful to provide controlled power. The elements in power control circuit 1004 are not the only elements in receiver 1000 that perform such functions, however. Further use of these functions shall be discussed in relation to power conditioning circuit 1008.

Display circuit 1006 receives information from microprocessor 1002 for display 1032. In this embodiment, display circuit 1006 includes LCD 1032 with internal direct drivers to provide a graphic representation of information signals 1054 processed by microprocessor 1002. This graphic representation is useful for user interaction and may be combined with a touch screen allowing the user to input information directly through display 1032. In one embodiment, a touch screen provides a user input through display circuit 1006, which further provides information input from the user to microprocessor 1002. Information that may be displayed by display circuit 1006 includes direction, location, and signal strength information. There may be many other types of information that may be helpful to be displayed during the operation of receiver 1000, depending on the application involved. Those skilled in the art are familiar with touch screens, LCD displays and other display/interface technologies.

Power conditioning circuit 1008 may create additional source voltages and filter or condition voltages for use by circuits within receiver 1000. For example, power conditioning circuit 1008 may connect to voltage rails 1021-1024 in receiver 1000 and filter those voltages thereby reducing noise or transient signals on the voltage rails 1021-1024. Power conditioning circuit 1008 may include capacitor 1025, voltage regulator 1031 and resistors 1026-1030 for filtering the voltages connected to voltage rails 1021-1024. In one embodiment, voltage regulator 1031 may be used to provide a constant voltage source within a range as well as to provide protection from transient signals on voltage rails 1021-1024.

Audio output circuit 1010 includes a connection to microprocessor 1002 for receiving audio signal 1055 to be conditioned and presented to speaker 1034. Audio signal 1055 is received by audio output circuit 1010 and may include information about the state of receiver 1000 and/or received signal (e.g. 1039). Audio signal 1055 may also include a synthesized human voice instructing the user how to perform a location detection or announcing the state of operation of receiver 1000. Audio signal 1055 may include any appropriate information (e.g. status of receiver 1000, status of signal 1039, etc.). Audio output circuit 1010 may include an amplifier (e.g. transistor 1056), speaker 1034 and passive elements to bias the amplifier and/or speaker (e.g. resistor 1057 and capacitor 1058). In one embodiment, the audio output signal comes into audio output circuit 1010 from microprocessor 1002 and is amplified by bipolar junction transistor 1056. The amplified signal is then passed to speaker 1034 and passed out as an acoustic wave.

Signal selection circuit 1012 includes a coupling to inductors (e.g. inductors individually connected to a selection device) used for measuring a field and/or detecting a signal (e.g. signal 110 of FIG. 1). Signal selection circuit 1012 also includes a selection element (e.g. switch 1059). Signal selection circuit 1012 includes inductors 1035-1037 and antenna 1038 that receive and/or detect signals radiated near receiver 1000. Resistors 1060-1066 bias and filter these signals before they reach switch 1059. Resistors 1067-1070 divide the signals before they reach switch 1059 and thereby create other signals for selection by switch 1059 and processing by microprocessor 1002. Signal selection circuit 1012 connects to through signal 1039 to signal amplification circuit 1014. For example, one connection may be used for analog and/or digital data on signal 1039 being sent to signal amplification circuit 1014 to condition (e.g. amplify) signal 1039 before it is sent to microprocessor 1002. Other connections 1071 with microprocessor 1002 may be used to control the signal selection process and thereby control which signal 1039 is sent to signal amplification circuit 1014. For example, the status of microprocessor 1002 (e.g. state of operation, user-requested inquiry into circuit or signal characteristics, etc.) may alter the function of signal selection circuit 1012 through commands carried through connections 1071.

Signal amplification circuit 1014 includes gain stage element 1072, analog-to-digital converters (ADCs) 1073 and 1074. Signal amplification circuit 1014 also includes resistors 1075-1078 and 1083-1085, as well as capacitors 1079-1082 to bias, filter and/or set gain values for gain stage element 1072. For example, signals may enter signal selection circuit 1012 in a fragile state (e.g. low power). Furthermore, the input impedance of some elements in receiver 1000 (e.g. ADCs 1073 and 1074) may affect the reception of signals if buffering (e.g. gain stage element 1072) is not used. Gain stage element 1072 here is implemented as a dual amplifier and therefore provides two gain stages that improve signal quality. Signal amplification circuit 1014 also includes ADCs 1073 and 1074 for converting signal 1039 after it is amplified by gain stage element 1072 into digital outputs 1086. Digital outputs 1086 provide microprocessor 1002 with digital representations (e.g. serial, parallel, synchronous) of signal 1039 for further processing.

Receiver 1000 may also include a memory (not shown) configured to store information relating to signal 1039 as detected by receiver 1000. For example, information relating to signal 1039 may be stored for creating a map of detected locations and/or providing a guide of recently detected strengths of signal 1039. In one embodiment, memory may be integrated with microprocessor 1002. In another embodiment, memory may be separate from microprocessor 1002 and may be accessed (e.g. random access memory) by the microprocessor. In another embodiment, memory may be accessed to retrieve information pertaining to a signal characteristic and/or a time signal 1039 was detected.

Information stored in memory, may be used by microprocessor 1002 to generate a map, trace, print out or guide. For example, stored information may be combined with presently detected signals and/or a present state of receiver 1000 to create comparisons of presently detected signals to previously detected signals. The microprocessor 1002 may thereby create a map or guide of a circuit to direct a user along the path of the circuit. Memory may also store information relating to detected signals that were not selected by signal selection circuit 1012 when received, yet may be desirable to be retrieved later from memory. The microprocessor 1002 may thereby be able to restore a particular characteristic (e.g. distance or direction) of a previously detected signal even though the user did not view that characteristic when the measurements were being made. In this way the microprocessor 1002 can access the memory to provide the user with a "replay" of the detected signals in case, for example, the user missed a particular characteristic of interest.

Figure 11:
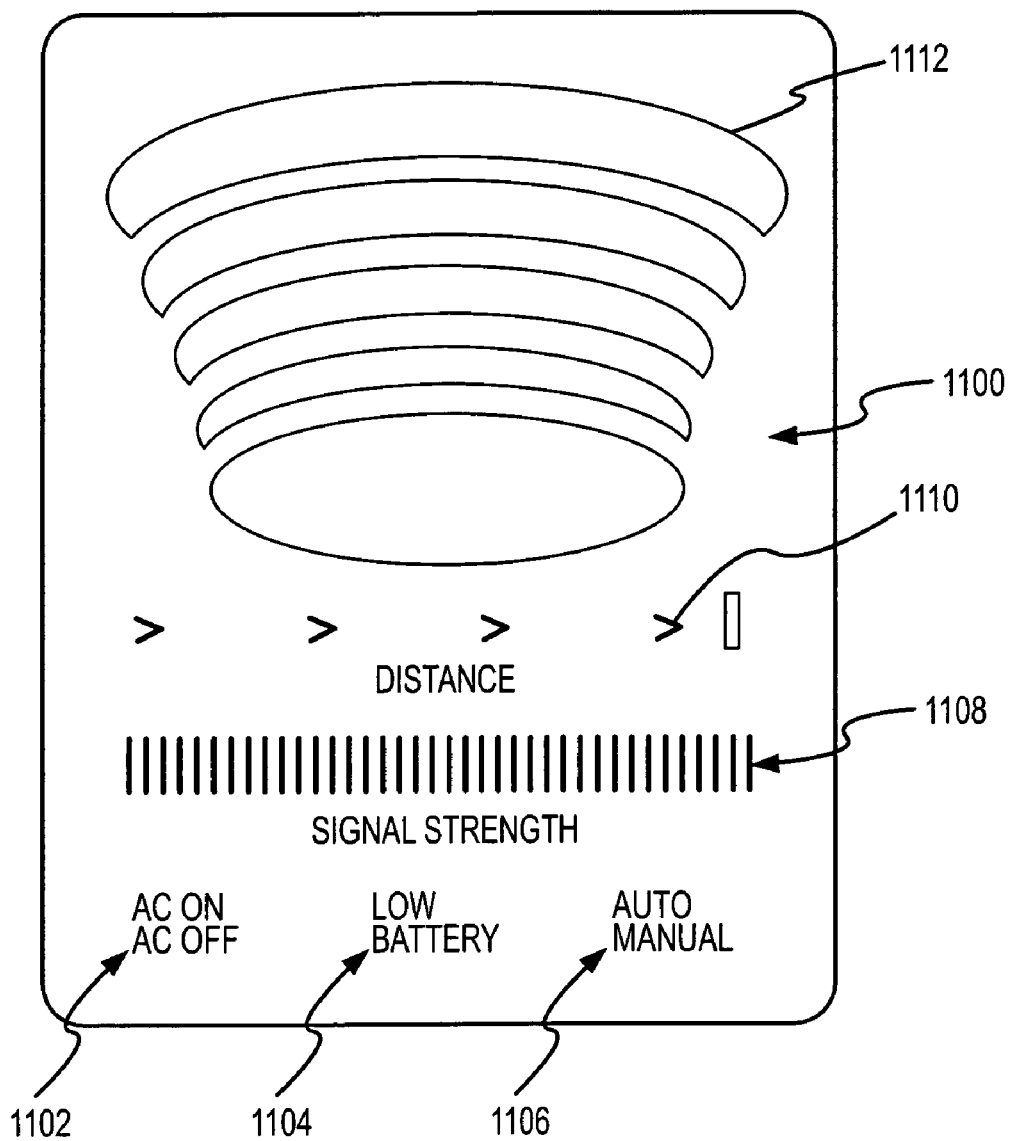
FIG. 11 illustrates an exemplary display for a receiver.

FIG. 11 illustrates an embodiment of graphical interface 1100 on a display in receiver 104. Graphical interface 1100 includes information relating to condition of circuit 1102, condition of an internal power source 1104, present gain mode 1106, signal strength 1108, location of circuit 1110 and comparison of signal strength change with location change 1112. Graphical interface 1100 may also include a touch-screen or other technologies appropriate for one-way or two-way interaction. Condition of circuit 1102, as depicted by graphical interface 1100 may include any appropriate circuit characteristic. This may include any feature of signal 110 as detected or as processed by receiver 104. Condition of an internal power source 1104 indicates a status of power internal to receiver 104 and may include a level of a battery and/or a connection to an outside power source.

Present gain mode 1106 depicts whether receiver 104 is an automatic gain mode or manual gain mode, but it may also include other appropriate gain modes. Signal strength 1108 may represent a present, past or any appropriate signal strength or combination thereof. Graphical interface 1100 may depict signal strength 1108 in any appropriate fashion, manner, or means (e.g. bar graph, color-coded bar, varying light intensity). Location of circuit 1110 may represent a present location, past location or any appropriate location of circuit or combination thereof. Graphical interface 1100 may depict location of circuit 1110 in any appropriate fashion, manner, or means (e.g. arrow, scaled graph, map with location marker). Comparison of signal strength change with location change 1112 may represent any combination of the information and/or depictions described for signal strength 1108 and location of circuit 1110. Additionally, comparison of signal strength change with location change 1112 may include any appropriate information retrieved from memory or any other appropriate source (e.g. user input).

In one embodiment, graphical interface 1100 may represent information relating to location of circuit 1100 in a three-dimensional format. For example, the information may be represented by a two-dimensional depiction of the information that utilizes a perspective view to indicate depth of field. The three-dimensional information relating to location of circuit 1110 may include information detected by receiver 104 relating to the lateral, vertical, and/or depth characteristics of circuit 106. A two-dimensional depiction of this information may include markers defining a scale arranged in a manner so as to imply perspective. The markers may therefore allow a user to obtain a three-dimensional understanding of circuit 106 and/or location of circuit 1110 from the two-dimensional depiction. A microprocessor (e.g., 1002) may process information relating to location of circuit 1110 to adapt the information for displaying by graphical interface 1100. For example, the microprocessor may transform measurements of inductors and/or stored data into a three-dimensional and/or a two-dimensional representation of circuit 106.

Although shown and described with respect to a particular graphical representation of information, those skilled in the art should readily recognize that the invention is not intended to be limited to the illustrated embodiment. For example, other forms of information, such as a map or a vector representation (e.g. radial coordinate plot), and/or a three-dimensional representation may be presented via graphical interface 1100.

Those skilled in the art will also readily recognize that receiver 1000 (or more generally, receiver 104 of FIG. 1) may be used without a transmitter and may operate completely within the scope of the invention without a transmitter. For example, the detected signal (e.g. signal 110 of FIG. 1) may be a standard AC power signal (e.g. 60 Hertz) having a component that radiates from a circuit (e.g. circuit 106 of FIG. 1). Such may occur with powering of the circuit at a circuit breaker box within a building. The receiver (e.g. 1000) may detect this AC power signal and process it as described above, thereby determining characteristics of the signal and circuit without the use of a transmitter such as 102.

Circuit 106, while not part of system 100, may be used by system to carry signal and may be of any appropriate type, configuration, arrangement or makeup (e.g. a power line, a phone line, a category 5 cable, a twisted pair, etc.). In one embodiment, circuit 106 is an electrical circuit, capable of carrying electrical signals along one or more conductors. The one or more conductors may be shielded, and may carry other signals in addition to signal (e.g. 108 and/or 110). In another embodiment, circuit 106 is plumbing capable of carrying a fluid. Transmitter 102 may generate signal 110 while transmitter 102 is within plumbing and optionally while being carried along with the fluid. In another embodiment, circuit 106 is plumbing made of a conductive material and transmitter couples and/or connects with plumbing. As such, circuit 106 may be one of many circuits present within an area under test. The area under test may be any appropriate area, volume, region or path (e.g. wall, room, building, garden, sewer drain). Other circuits may be a type that is similar to, different from circuit 106.

Figure 12A:
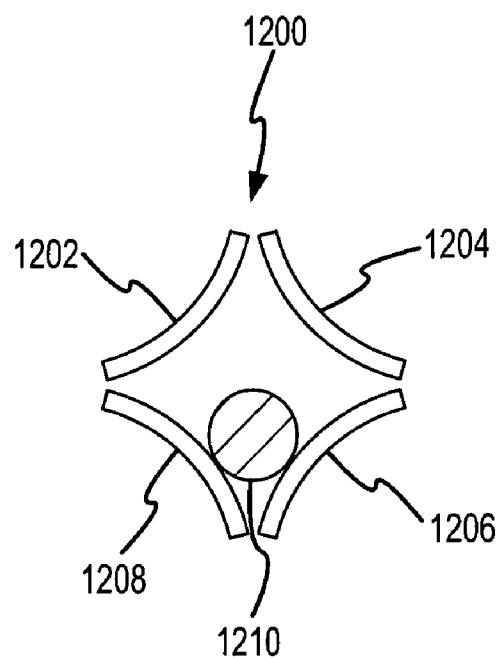
FIG. 12A illustrates an exemplary sensor configuration for determining a position of a receiver.

FIG. 12A illustrates an exemplary apparatus 1200 contained inside receiver 104 capable of determining an orientation of receiver 104. For example, apparatus 1200 may include connection element 1210. Apparatus 1200 may also include side elements 1202, 1204, 1206 and 1208 substantially positioned to form a substantially closed cavity. Two side elements (shown here as 1206 and 1208) may be simultaneously contacted by connection element 1210 thereby causing conductivity between two side elements to change. This change may operate as a sort of switch that may be registered by a microprocessor of the receiver (e.g., microprocessor 1002 of FIG. 10) such that the microprocessor determines the position of the receiver.

Figure 12B:
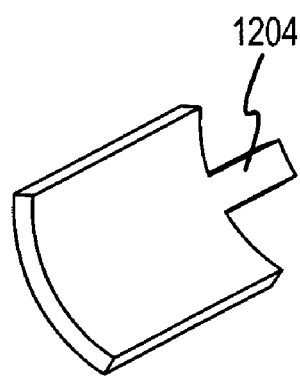
FIG. 12B illustrates a perspective view of a side element of the sensor of FIG. 12A.

Connection element 1210 may contact two side elements (e.g. 1206 and 1208) due to gravity. For example, as the receiver rotates, connection element 1210 may "roll" because of gravity into a position in which two side elements are contacted. In this embodiment, side elements 1202, 1204, 1206 and 1208 are curved to cause connection element 1210 to more stably rest in a position contacting two side elements (e.g. 1206 and 1208). FIG. 12B illustrates a perspective view of one such side element in side element 1204. In this example, side element 1204 is curved to provide (in combination with another similarly curved side elements) a stable resting position for connection element 1210 in response to one type of rotation of the apparatus 1200.

Apparatus 1200 may be used to rotate the information displayed on graphical interface 1100 in order that the information displayed appears upright regardless of the orientation of receiver 104. In this example, the displayed information can remain stationary with respect to a given reference frame (e.g., a gravitational reference frame defining an "up" and a "down") even while receiver 104 is rotated. Receiver 104 may be rotated for any number of reasons including increased comfort of the user in holding receiver 104 or the user tracing circuit 106 with receiver 104 into a cramped space (e.g., the corner of an attic).

In addition, not all of the information displayed must be rotated equally. For example, information relating to location of circuit (e.g., 1110) may be rotated with receiver 104 while condition of an internal power source (e.g., 1104), present gain mode (e.g., 1106), and/or signal strength (e.g., 1108) may remain displayed by graphical interface 1100 in the same position regardless of the orientation of receiver 104. Receiver 104 may also allow any of these features to be controlled by the user according to the user's preference. A microprocessor (e.g., 1002) configured with receiver 104 may perform computations on information displayed in order to rotate parts or all of the information. The microprocessor may also process the user's input regarding a preference of which information may be displayed. Such information may, therefore, be rotated in response to receiver 104 being rotated.

Figure 13:
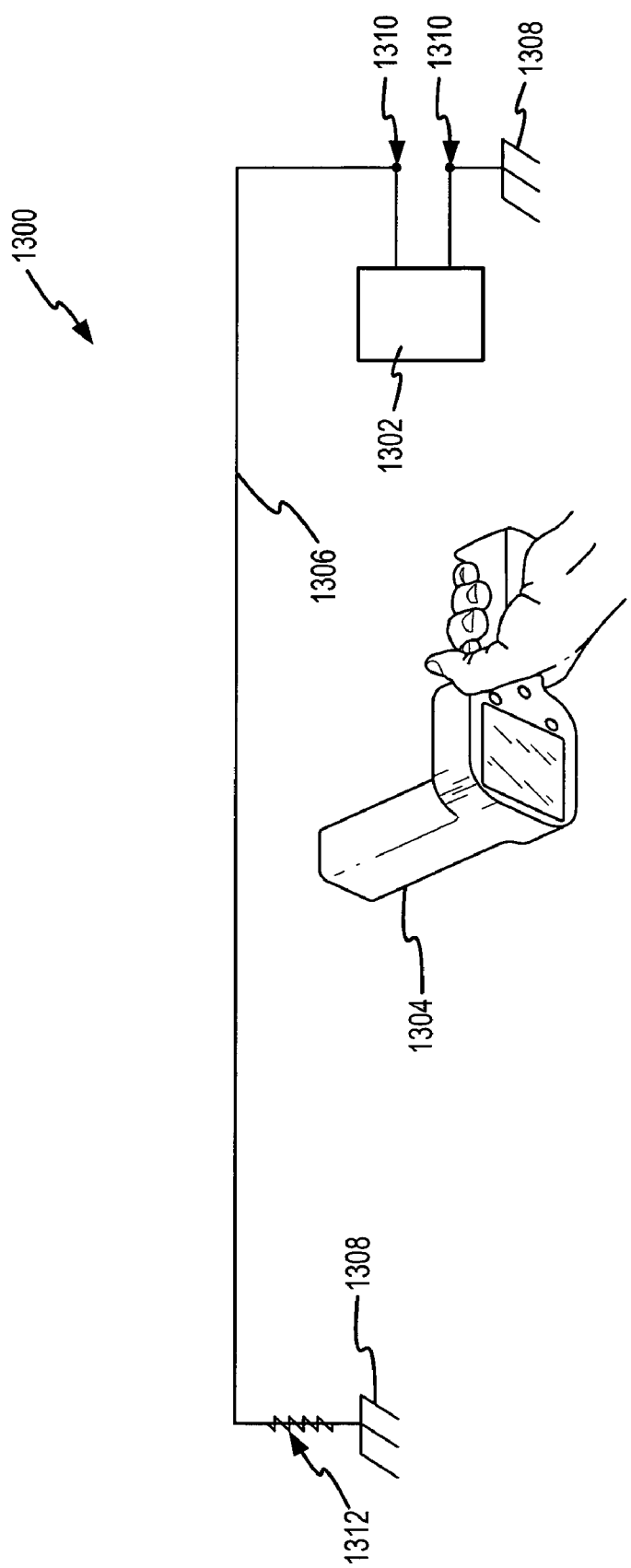
FIG. 13 illustrates an exemplary application of a circuit detection system.

FIG. 13 illustrates an exemplary application 1300 of transmitter 1302 and receiver 1304 for locating an electrical circuit 1306. In this example, transmitter 1302 couples with circuit 1306 at connection points 1310, which are illustrated here as a direct connection. Transmitter 1302 generates signal 108, and imparts signal 108 on circuit 1306 through a coupling illustrated by connection points 1310. Receiver 1304 detects signal 110 on circuit at a point distal from transmitter 1302 and connection points 1310. Circuit 1306 includes load 1312, which generally represents an element utilizing at least one signal on circuit 1306. Receiver 1304 may also detect or receive signal 1310 at load 1312 or at a point near load 1312. In addition, connection points 1310 are illustrated as a parallel connection, however any appropriate type, configuration or arrangement of connection and/or coupling may be substituted. In one embodiment, transmitter 1302 may be connected to circuit 1306 and activated to generate signal 108 and provide it to connection points 1310 before receiver 1304 is activated to detect signal 110. In another embodiment, receiver 1304 may scan circuit 1306 in anticipation of transmitter 1302 being activated and/or connected.

Figure 14:
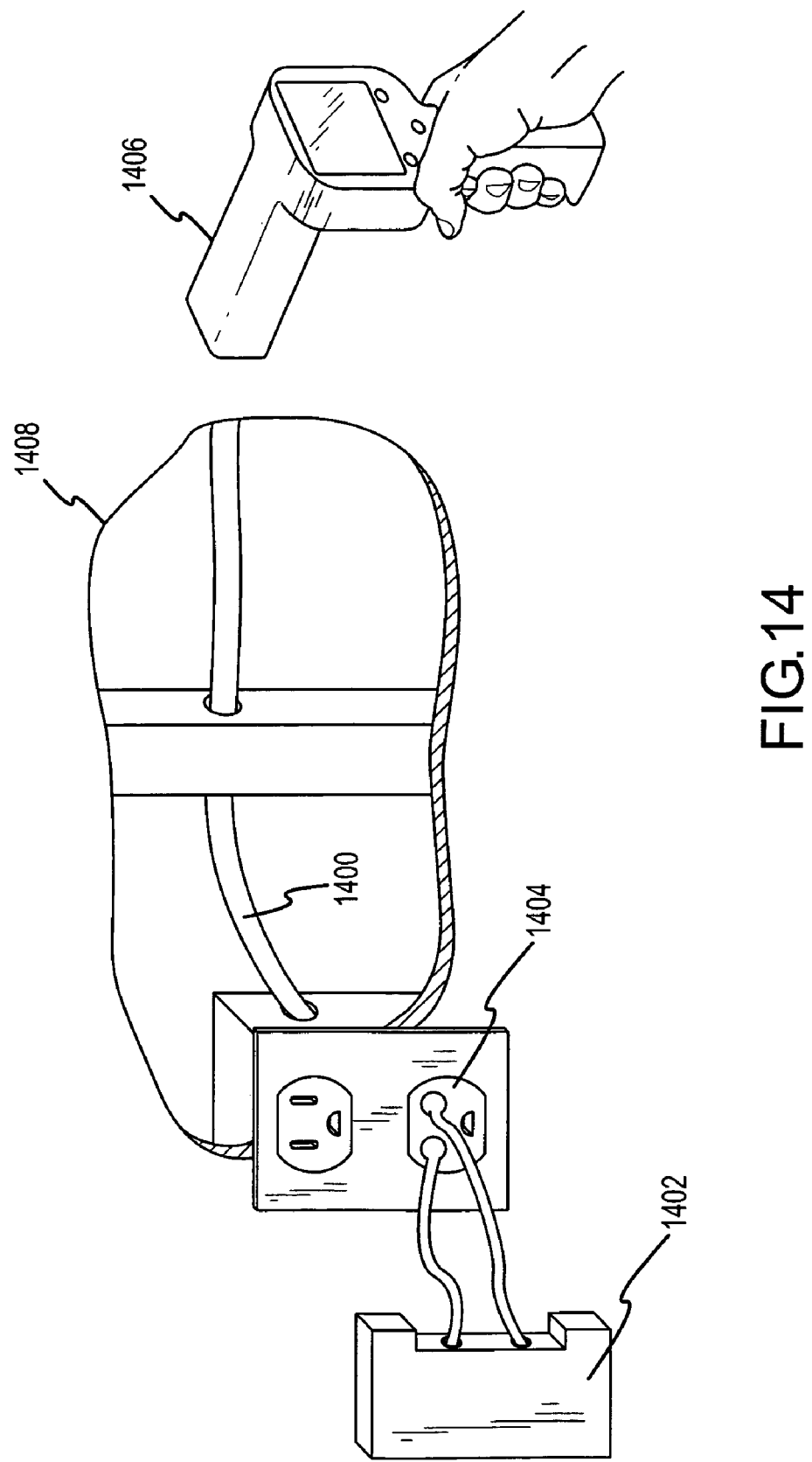
FIG. 14 illustrates an exemplary application of a circuit detection system for detecting a circuit line within a wall.
Figure 15:
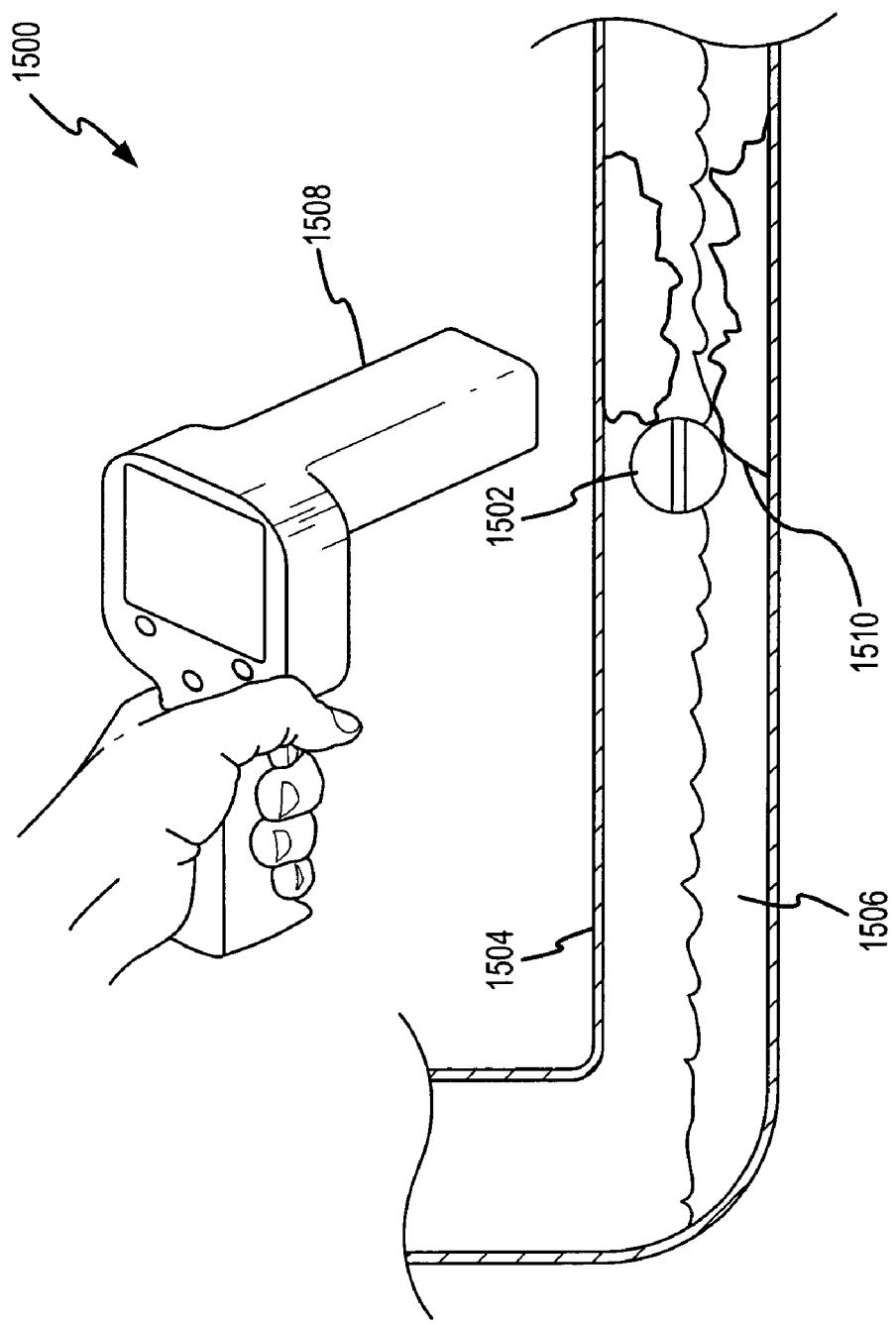
FIG. 15 illustrates an exemplary application of a circuit detection system for plumbing.
Figure 16:
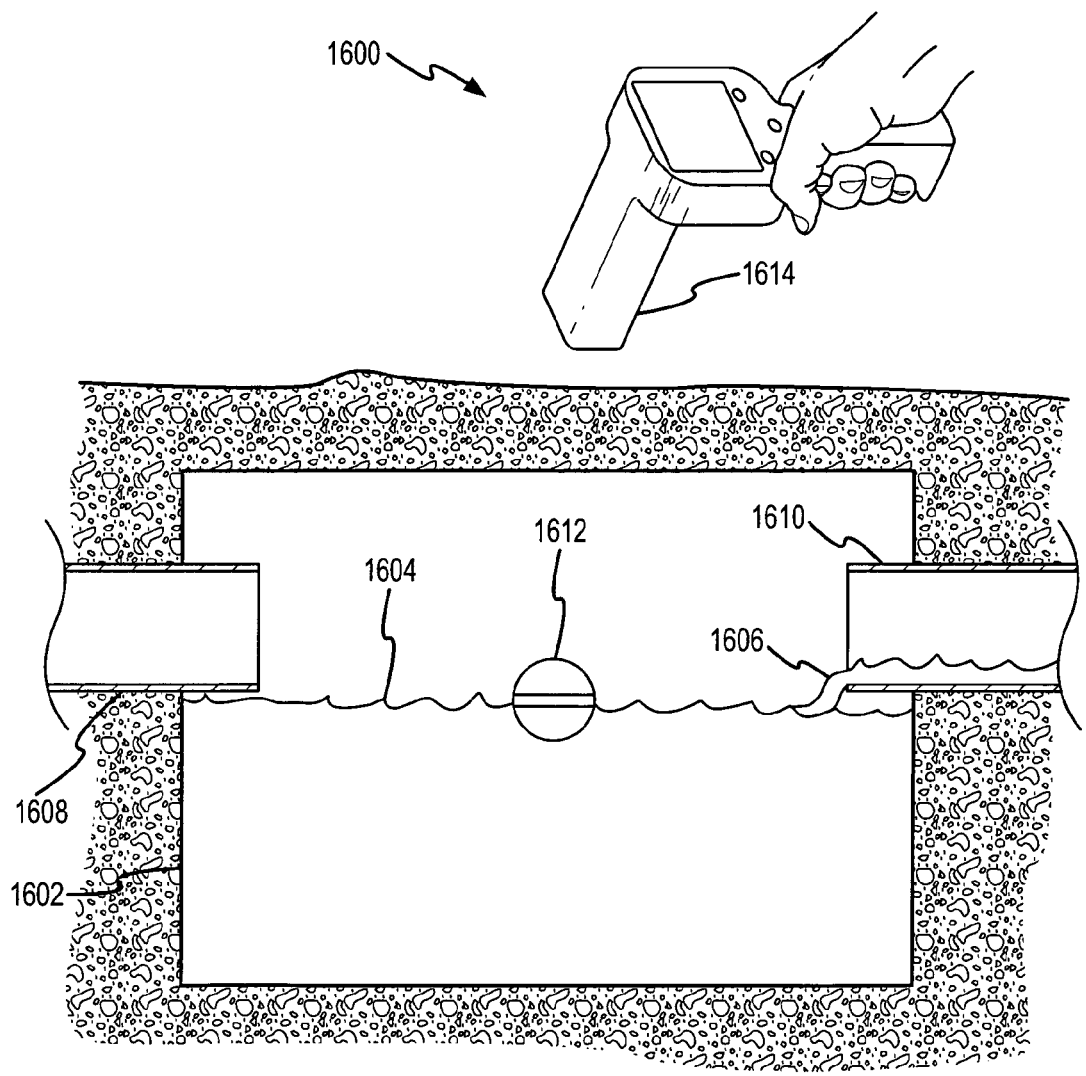
FIG. 16 illustrates another exemplary application of a circuit detection system for plumbing.

The embodiments, examples, and elements discussed herein are subject to various modifications, substitutions and refinements, any of which could be combined as appropriate for the applications discussed herein and for other applications. FIGS. 14-16 illustrate several applications of system to locate circuits of different types and for different purposes. The applications and embodiments discussed herein are meant as examples and are not meant to limit the useful applications or embodiments possible.

FIG. 14 illustrates an embodiment of system 100 as applied to a home wiring circuit 1400 to determine a location and/or configuration associated with home wiring circuit 1400. Transmitter 1402 connects to the home wiring circuit 1400 through a standard wall outlet 1404. Transmitter 1402 generates signal 108 and transmits or imparts signal 108 onto home wiring circuit 1400. Receiver 1406 may detect signal 110 on home wiring circuit 1400 at a point distal from both standard wall outlet 1404 and transmitter 1402. For example, home wiring circuit 1400, as illustrated herein, travels a route from standard wall outlet 1404, behind drywall 1408 (here shown cut away to expose a view of home wiring circuit 1400). Receiver 1406 may receive a radiated component of the signal 108 through drywall 1408 as signal 110 to determine a configuration of home wiring circuit 1400.

FIG. 15 illustrates an embodiment of system 1500 as applied to plumbing 1504 to determine a location and/or configuration associated with plumbing 1504. In this embodiment, transmitter 1502 is carried down plumbing 1504 by a fluid 1506 in plumbing 1504. Fluid 1506 may be carried down plumbing 1504 under the influence of gravity or through pressure of fluid 1506. Transmitter 1502 enters plumbing 1504 through an opening (e.g., a drain). Transmitter 1502 follows the path of plumbing 1504, generating and transmitting signal (e.g. 108/110 of FIG. 1). The signal may be generated and/or transmitted continuously or in response to a physical event. Such a physical event may include a part of transmitter 1502 being contacted by fluid 1506, transmitter 1502 moving under the influence of fluid 1506, transmitter 1502 being blocked by an obstruction in plumbing 1504, receipt of an initiating signal or any other appropriate event.

Receiver 1508 may detect signal 110 from any position along plumbing 1504. Receiver 1508 may also detect any aspect, characteristic, component or feature of signal 110 (e.g. presence, strength, direction, frequency, etc.). For example, receiver 1508 may detect the presence and strength of signal 110 to determine whether transmitter is blocked, impeded or restrained by blockage 1510. The movement of the source of the signal as received by receiver 1508 may indicate that the transmitter 1502 is moving. As such, receiver 1508 may determine whether transmitter 1502 is able to move freely with fluid 1506. Transmitter 1502 may also include a structure (e.g. 508 as shown in FIG. 5) allowing it to be retrieved.

FIG. 16 illustrates another embodiment of system adapted to determine any appropriate characteristic of a tank within plumbing 1600. For example, system 1600 may determine location of tank 1602, fluid level of tank 1604, location of inlet 1610 and/or outlet 1608 of tank or other appropriate characteristics of tank 1602. In this embodiment, transmitter 1612 is adapted to float in fluid 1606. Transmitter 1612 may also have another level of buoyancy in fluid 1606. Receiver 1614 may detect any aspect, characteristic, component or feature of signal 110 (e.g. presence, strength, direction, frequency). Receiver 1614 may also determine whether transmitter 1612 is floating in fluid 1606, and thereby the density of fluid 1606.

While the invention has been illustrated and described in detail in the drawings and foregoing description, such illustration and description is to be considered as exemplary and not restrictive in character. Accordingly, it should be understood that only the preferred embodiment and minor variants thereof have been shown and described and that all changes and modifications that come within the spirit of the invention are desired to be protected.

What is claimed is:

1. A method of determining a conductor configuration, including:
    inducing a signal on a conductor at a first point;
    receiving a radiated component of the signal at a second point that is distal to the first point, wherein receiving a radiated component of the signal includes detecting magnetic energy with at least two inductors that are configured at a substantially right angle; and
    individually or combinatorially selecting between outputs of the at least two inductors using a switching means coupled to each of the inductors to determine a signal strength of the radiated component of the signal and to determine a configuration of the conductor based on the signal strength.

2. The method of claim 1, further including determining the configuration of the conductor to determine a connection of the conductor at a circuit box.

3. The method of claim 1, further including determining the configuration of the conductor to determine a location of the conductor within a structure.

4. The method of claim 1, wherein inducing a signal includes inducing the signal on a conductor that is carrying another signal.

5. The method of claim 1, wherein inducing a signal includes electrically coupling a transmitter to the first point.

6. The method of claim 1, wherein processing includes:
    measuring an electromagnetic parameter of a first of the at least two inductors; and
    measuring an electromagnetic parameter of a second of the at least two inductors.

7. The method of claim 1, further including displaying information in response to receiving the radiated component of the signal, wherein the information includes the signal strength.

8. The method of claim 7, wherein the displaying includes updating the information with direction information indicating a path of the conductor.

9. The method of claim 7, wherein the displaying includes updating the information with direction information indicating a device orientation.

10. The method of claim 7, wherein said displaying information includes rotating displayed information with respect to an orientation of a receiver.

11. The system of claim 1, wherein the receiver is configured to process a signal from each inductor.

12. The system of claim 11, wherein said at least two inductors are not coupled to one another.

13. The system of claim 12, wherein said receiver is configured to compare a measurement of a first inductor of said at least two inductors with a measurement of a second inductor of the at least two inductors.

14. A system that determines a circuit configuration, comprising:
    a transmitter that induces a signal in a conductor at a first location; and
    a receiver that detects a radiated component of the signal at a second location to determine a configuration of the conductor, wherein the second location is distal to the first location, the receiver including at least two inductors configured at a substantially right angle, wherein each inductor receives the radiated component of the signal, the receiver further including a switch that individually or combinatorially selects between outputs of the at least two inductors to determine a signal strength of the radiated component of the signal and to determine a configuration of the conductor based on the signal strength.

15. The system of claim 14, wherein the receiver is further configured to determine the configuration of the conductor within a structure.

16. The system of claim 15, wherein the configuration of the conductor includes the distance from the conductor to the receiver.

17. The system of claim 15, wherein the configuration of the conductor includes the direction of the conductor.

18. The system of claim 14, wherein the transmitter is configured to induce the signal on a conductor that is carrying another signal.

19. The system of claim 14, wherein the transmitter is configured to couple electrically to the conductor at the first location.

20. The system of claim 14, wherein the receiver is further configured to determine a connection of the conductor at a circuit box.

21. The system of claim 14, wherein the receiver includes a display configured to display information relating to the radiated component of the signal.

22. The system of claim 21, wherein the information includes a signal strength, a path of the conductor, a receiver orientation, or a combination thereof.

23. The system of claim 21, wherein the display is configurable to rotate displayed said information based on an orientation of the receiver.

24. An apparatus configured to determine a location of a circuit, comprising:

a first inductor and a second inductor, said first inductor configured at a substantially right angle in relation to said second inductor;

a signal selection means communicatively coupled to each of the inductors for individually or combinatorially selecting outputs of the inductors;

a signal conditioning means coupled to the signal selection means;

a processor coupled to the signal conditioning means to compare measurements from each of the inductors to determine the location of the circuit; and a display coupled to the processor to display information relating to the location of the circuit.

* * * * *